United States Patent
Vronsky

(10) Patent No.: US 10,355,208 B2
(45) Date of Patent: Jul. 16, 2019

(54) PRINTING SYSTEM ASSEMBLIES AND METHODS

(71) Applicant: Kateeva, Inc., Newark, CA (US)

(72) Inventor: Eliyahu Vronsky, Los Altos, CA (US)

(73) Assignee: Kateeva, Inc., Newark, CA (US)

( * ) Notice: Subject to any disclaimer, the term of this patent is extended or adjusted under 35 U.S.C. 154(b) by 0 days.

(21) Appl. No.: 15/772,038

(22) PCT Filed: Sep. 20, 2016

(86) PCT No.: PCT/US2016/052683
§ 371 (c)(1),
(2) Date: Apr. 27, 2018

(87) PCT Pub. No.: WO2017/053307
PCT Pub. Date: Mar. 30, 2017

(65) Prior Publication Data
US 2018/0315923 A1   Nov. 1, 2018

Related U.S. Application Data

(60) Provisional application No. 62/232,339, filed on Sep. 24, 2015.

(51) Int. Cl.
*B41J 3/28* (2006.01)
*B41J 13/00* (2006.01)
(Continued)

(52) U.S. Cl.
CPC ............ *H01L 51/0004* (2013.01); *B41J 3/28* (2013.01); *B41J 13/00* (2013.01); *B41J 29/02* (2013.01);
(Continued)

(58) Field of Classification Search
CPC ..... B41J 3/28; B41J 13/00; B41J 29/02; B41J 29/13; B41J 29/377; H01L 51/0004;
(Continued)

(56) References Cited

U.S. PATENT DOCUMENTS 5,890,580 A   4/1999   Hashimoto et al.
6,113,698 A * 9/2000   Raaijmakers ....... C23C 16/0209
                                                        118/715

(Continued)

OTHER PUBLICATIONS

International Search Report and Written Opinion dated Jan. 13, 2017, to PCT Application No. PCT/US16/52663.

*Primary Examiner* — Anh T Vo
(74) *Attorney, Agent, or Firm* — Paula J. Tostado

(57) ABSTRACT

The present teachings disclose various embodiments of a printing system for printing a substrate, in which the printing system can be housed in a gas enclosure, where the environment within the enclosure can be maintained as a controlled printing environment. A controlled environment of the present teachings can include control of the type of gas environment within the gas enclosure, the size and level particulate matter within the enclosure, control of the temperature within the enclosure and control of lighting. Various embodiments of a printing system of the present teachings can include an X-axis and a Y-axis motion system utilizing linear air-bearing technology, as well as an ultrasonic floatation table as a substrate apparatus that are configured to substantially decrease excess thermal load within the enclosure by, for example, eliminating or substantially minimizing the use of conventional electric motors. Additionally, an X-axis and a Y-axis motion system utilizing linear air-bearing motion systems, and an ultrasonic floatation table as a substrate apparatus are low-particle generating devices, which in conjunction with a filtration and circulation system can provide a low-particle printing system environment.

16 Claims, 18 Drawing Sheets

(51) Int. Cl.
  *B41J 29/02*    (2006.01)
  *B41J 29/13*    (2006.01)
  *B41J 29/377*   (2006.01)
  *H01L 51/00*    (2006.01)
  *F24F 3/16*     (2006.01)
  *H01L 51/56*    (2006.01)

(52) U.S. Cl.
  CPC .............. *B41J 29/13* (2013.01); *B41J 29/377* (2013.01); *H01L 51/0029* (2013.01); *H01L 51/0096* (2013.01); *F24F 3/161* (2013.01); *F24F 2003/165* (2013.01); *H01L 51/56* (2013.01); *Y02E 10/549* (2013.01)

(58) Field of Classification Search
  CPC ................ H01L 51/0029; H01L 51/0096; H01L 51/56; F24F 3/161; F24F 2003/165; Y02E 10/549
  See application file for complete search history.

(56) References Cited

U.S. PATENT DOCUMENTS

| | | | |
|---|---|---|---|
| 7,530,778 B2 * | 5/2009 | Yassour | B65G 51/03 384/12 |
| 2008/0229811 A1 | 9/2008 | Zhao et al. | |
| 2008/0273910 A1 | 11/2008 | Verlinden et al. | |
| 2008/0308037 A1 * | 12/2008 | Bulovic | B05B 17/0638 118/302 |
| 2009/0031579 A1 * | 2/2009 | Piatt | B41J 11/002 34/82 |
| 2013/0040061 A1 | 2/2013 | Lowrance et al. | |
| 2013/0206058 A1 | 8/2013 | Mauck et al. | |

\* cited by examiner

PRINTING SYSTEM ASSEMBLIES AND METHODS

CROSS REFERENCE TO RELATED APPLICATIONS

This application claims benefit to U.S. Provisional Application No. 62/232,339, filed Sep. 24, 2015; which is incorporated herein by reference in its entirety.

OVERVIEW

Interest in the potential of organic light-emitting diode (OLED) display technology has been driven by OLED display technology attributes that include demonstration of display panels that have highly saturated colors, are high-contrast, ultrathin, fast-responding, and energy efficient. Additionally, a variety of substrate materials, including flexible polymeric materials, can be used in the fabrication of OLED display technology. Though the demonstration of displays for small screen applications, primarily for cell phones, has served to emphasize the potential of the technology, challenges remain in scaling high volume manufacturing across a range of substrate formats in high yield.

With respect to scaling of formats, a Gen 5.5 substrate has dimensions of about 130 cm×150 cm and can yield about eight 26" flat panel displays. In comparison, larger format substrates can include using Gen 7.5 and Gen 8.5 mother glass substrate sizes. A Gen 7.5 mother glass has dimensions of about 195 cm×225 cm, and can be cut into eight 42" or six 47" flat panel displays per substrate. The mother glass used in Gen 8.5 is approximately 220 cm×250 cm, and can be cut to six 55" or eight 46" flat panel displays per substrate. One indication of the challenges that remain in scaling of OLED display manufacturing to larger formats is that the high-volume manufacture of OLED displays in high yield on substrates larger than Gen 5.5 substrates has proven to be substantially challenging.

In principle, an OLED device may be manufactured by the printing of various organic thin films, as well as other materials, on a substrate using an OLED printing system. Such organic materials can be susceptible to damage by oxidation and other chemical processes. Housing an OLED printing system in a fashion that can be scaled for various substrate sizes and can be done in an inert, substantially low-particle printing environment can present a variety of engineering challenges. Manufacturing tools for high throughput large-format substrate printing, for example, such as printing of Gen 7.5 and Gen 8.5 substrates, require substantially large facilities. Accordingly, maintaining a large facility under an inert atmosphere, requiring gas purification to remove reactive atmospheric species, such as water vapor, oxygen, and ozone, as well as organic solvent vapors, as well as maintaining a substantially low-particle printing environment, has proven to be significantly challenging.

As such, challenges remain in scaling high volume manufacturing of OLED display technology across a range of substrate formats in high yield. Accordingly, there exists a need for various embodiments a gas enclosure system of the present teachings that can house an OLED printing system, in an inert, substantially low-particle environment, and can be readily scaled to provide for fabrication of OLED panels on a variety of substrates sizes and substrate materials. Additionally, various gas enclosure systems of the present teachings can provide for ready access to an OLED printing system from the exterior during processing and ready access to the interior for maintenance with minimal downtime.

BRIEF DESCRIPTION OF THE DRAWINGS

A better understanding of the features and advantages of the present disclosure will be obtained by reference to the accompanying drawings, which are intended to illustrate, not limit, the present teachings. In the drawings, which are not necessarily drawn to scale, like numerals may describe similar components in different views. Like numerals having different letter suffixes may represent different instances of similar components.

DETAILED DESCRIPTION OF THE DISCLOSURE

The present teachings disclose various embodiments of a printing system for printing a substrate, in which the printing system can be housed in a gas enclosure, where the environment within the enclosure can be maintained as a controlled printing environment. A controlled environment of the present teachings can include control of the type of gas environment within the gas enclosure, the size and level particulate matter within the enclosure, control of the temperature within the enclosure and control of lighting.

According to various embodiments of the present teachings, a substrate can be conveyed through a printing system using an ultrasonic substrate floatation table with a conveyance assembly. For various embodiments of systems and methods of the present teachings, a conveyance assembly can be a Y-axis motion system that can be based on an air-bearing gripper system. Various embodiments of a printing system of the present teachings can include a Y-axis motion system that is configured to substantially decrease excess thermal load within the gas enclosure, for example, by eliminating or substantially minimizing the use of conventional electric motors. Additionally, various embodiments of a Y-axis motion system of the present teachings can include a gripper motion control assembly of a Y-axis motion system configured to provide dynamic rotation of the orientation of a substrate about the theta-Z (θ-Z) axis during Y-axis travel to maintain a high degree of precision for substrate orientation parallel to the axis of travel.

Figure 1A:
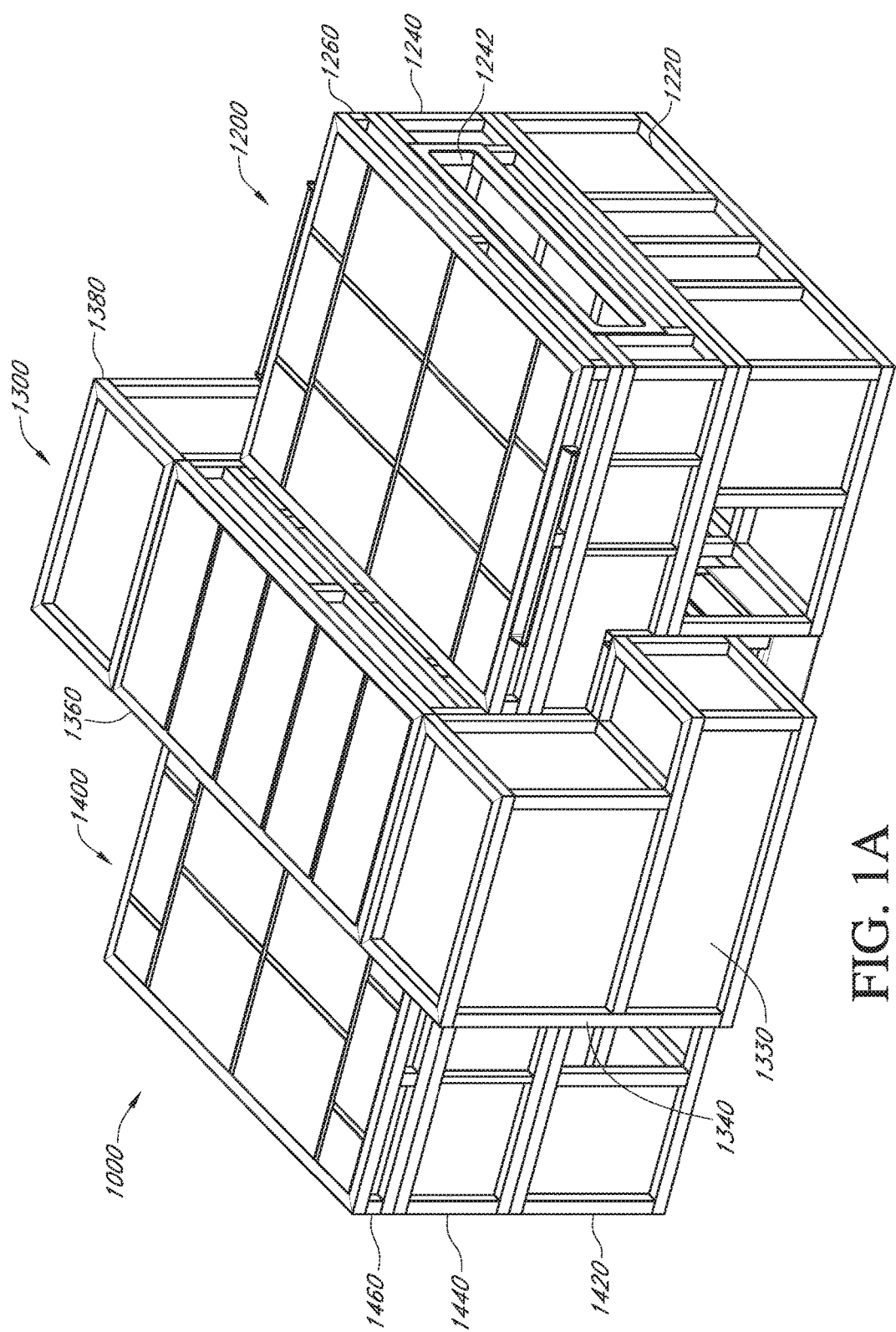
FIG. 1A is a front perspective view of view of a gas enclosure assembly in accordance with various embodiments of the present teachings.

FIG. 1A depicts a perspective view gas enclosure 1000 in accordance with various embodiments of a gas enclosure assembly of the present teachings. Gas enclosure 1000 can include front panel assembly 1200, middle panel assembly 1300 and rear panel assembly 1400. Front panel assembly 1200 can include front ceiling panel assembly 1260, front wall panel assembly 1240, which can have opening 1242 for receiving a substrate, and front base panel assembly 1220. Rear panel assembly 1400 can include rear ceiling panel assembly 1460, rear wall panel assembly 1440 and rear base panel assembly 1420. Middle panel assembly 1300 can include first middle enclosure panel assembly 1340, middle wall and ceiling panel assembly 1360 and second middle enclosure panel assembly 1380, as well as middle base panel assembly 1320.

Additionally, as depicted in FIG. 1A, middle panel assembly 1300 can include first printhead management system substantially low particle environment, as well as a second printhead management system auxiliary panel assembly (not shown). Various embodiments of an auxiliary enclosure constructed as a section of a gas enclosure assembly can be sealably isolated from the working volume of a gas enclosure system. For various embodiments of systems and methods of the present teachings, an auxiliary enclosure can be less than or equal to about 1% of the enclosure volume of a gas enclosure system. In various embodiments of systems and methods of the present teachings, an auxiliary enclosure can be can be less than or equal to about 2% of the enclosure volume of a gas enclosure system. For various embodiments of systems and methods of the present teachings, an auxiliary enclosure can be less than or equal to about 5% of the enclosure volume of a gas enclosure system. In various embodiments of systems and methods of the present teachings, an auxiliary enclosure can be less than or equal to about 10% of the enclosure volume of a gas enclosure system. In various embodiments of systems and methods of the present teachings, an auxiliary enclosure can be less than or equal to about 20% of the enclosure volume of a gas enclosure system. Should the opening of an auxiliary enclosure to an ambient environment containing reactive gases be indicated for performing, for example, a maintenance procedure, isolating an auxiliary enclosure from the working volume of a gas enclosure can prevent contamination of the entire volume of a gas enclosure. Further, given the relatively small volume of an auxiliary enclosure in comparison to the printing system enclosure portion of a gas enclosure, the recovery time for an auxiliary enclosure can take significantly less time than recovery time for an entire printing system enclosure.

Figure 1B:
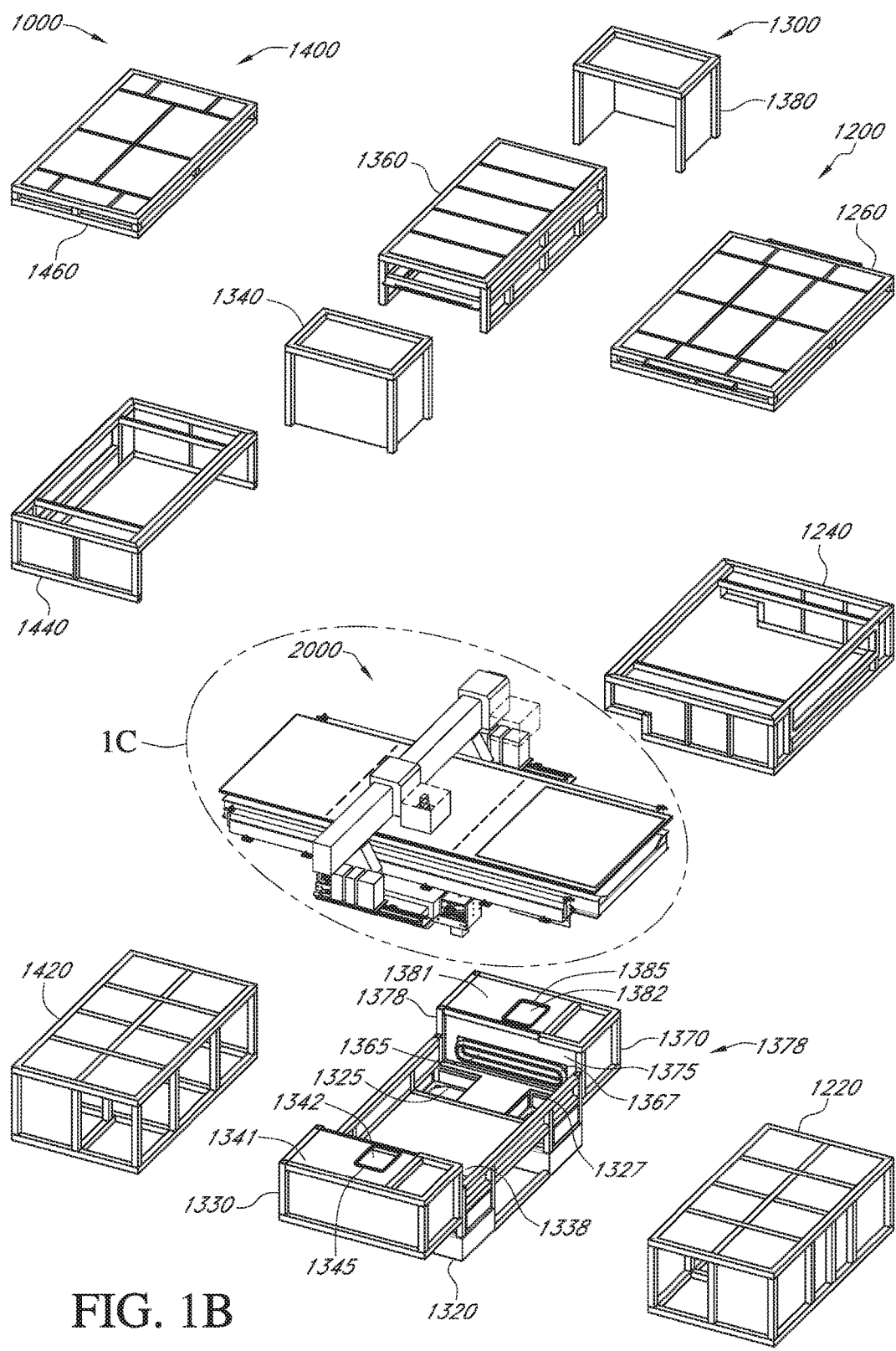
FIG. 1B depicts an exploded view of various embodiments of a gas enclosure assembly as depicted in FIG. 1A.

As depicted in FIG. 1B, gas enclosure 1000 can include front base panel assembly 1220, middle base panel assembly 1320, and rear base panel assembly 1420, which when fully-constructed form a contiguous base or pan on which printing system 2000 can be mounted. In a similar fashion as described for gas enclosure assembly 1000 of FIG. 1A, the various frame members and panels comprising front panel assembly 1200, middle panel assembly 1300, and rear panel assembly 1400 of gas enclosure 1000 can be joined around printing system 2000 to form a printing system enclosure. Front panel assembly 1200 can be contoured around printing system 2000 mounted to form a first tunnel enclosure section of a gas enclosure. Similarly, rear panel assembly 1400 can be contoured around printing system 2000 to form a second tunnel enclosure section of a gas enclosure. Additionally, middle panel assembly 1300 can be contoured around a bridge section of a printing system 2000 to form a bridge enclosure section of a gas enclosure. Together, a first tunnel enclosure section, a second tunnel section and a bridge enclosure section can form a printing enclosure section. As will be discussed in more detail herein, according to the present teachings, an auxiliary enclosure can be sealably isolated from a printing system enclosure during, for example, a printing process for performing various measurement and maintenance tasks, with little or no interruption to the printing process.

Further, a fully constructed gas enclosure assembly, such as gas enclosure 1000, when integrated with various environmental control systems can form various embodiments of a gas enclosure system including various embodiments of an OLED printing system, such as Printing system 2000. According to various embodiments of a gas enclosure system of the present teachings, environmental control of an interior volume defined by a gas enclosure assembly can include control of lighting, for example, by the number and placement of lights of a specific wavelength, control of particulate matter using various embodiments of a particle control system, control of reactive gas species using various embodiments of a gas purification system, and temperature control of a gas enclosure assembly using various embodiments of a thermal regulation system.

Figure 1C:
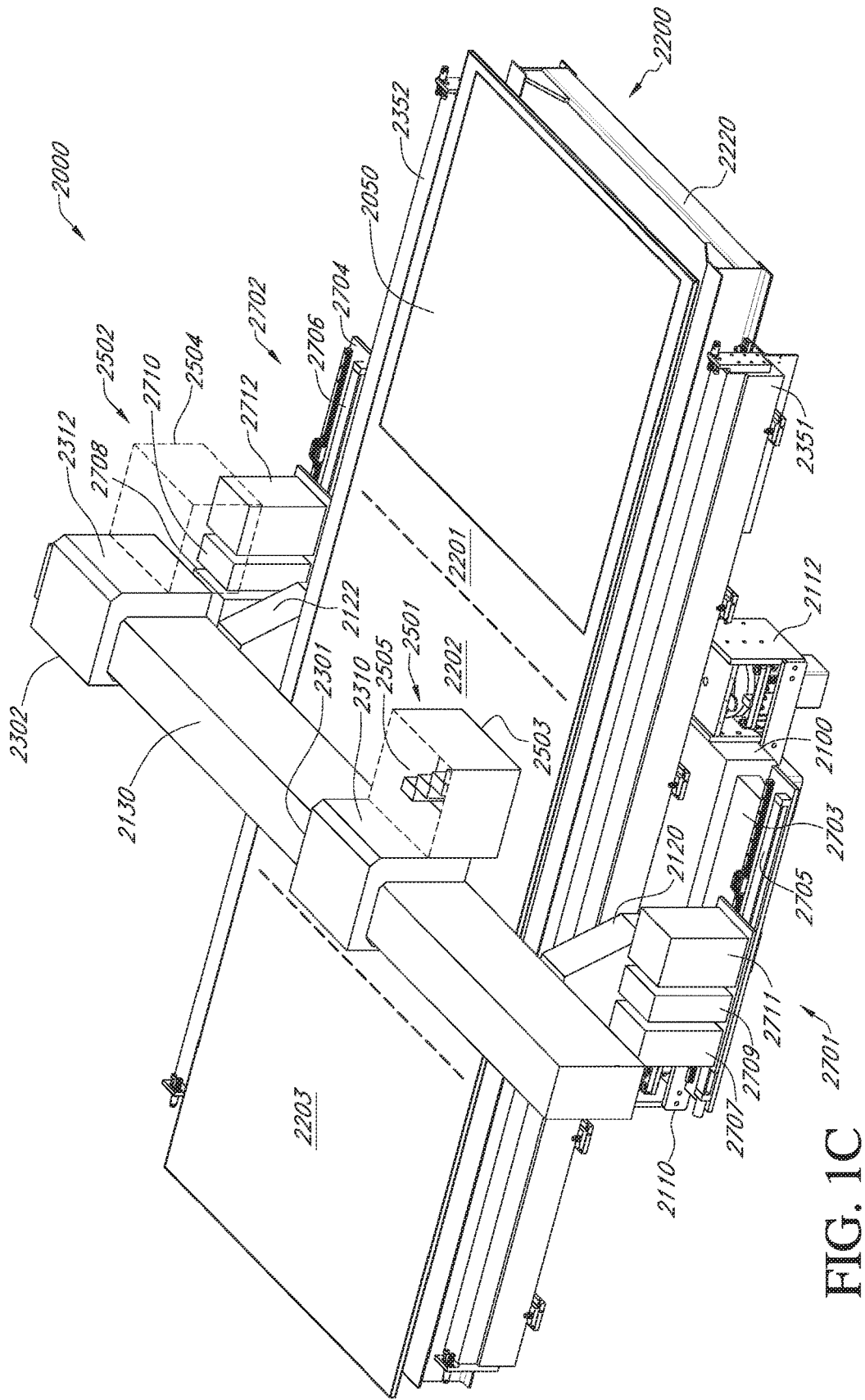
FIG. 1C depicts an expanded iso perspective view of the printing system depicted in FIG. 1B.

A printing system, such as printing system 2000 of FIG. 1B, shown in expanded view in FIG. 1C, can be comprised of several devices and apparatuses, which allow the reliable placement of ink drops onto specific locations on a substrate. These devices and apparatuses can include, but are not limited to, a printhead assembly, ink delivery system, a motion system for providing relative motion between a printhead assembly and a substrate, substrate support apparatus, substrate loading and unloading system, and printhead management system.

A printhead assembly can include at least one inkjet head, with at least one orifice capable of ejecting droplets of ink at a controlled rate, velocity, and size. The inkjet head is fed by an ink supply system which provides ink to the inkjet head. As shown in an expanded view of FIG. 1C, printing system 2000 can have a substrate, such as substrate 2050, which can be supported by a substrate support apparatus, such as a chuck, for example, but not limited by, a vacuum chuck, a substrate floatation chuck having pressure ports, and a substrate floatation chuck having vacuum and pressure ports. In various embodiments of systems and methods of the present teachings, a substrate support apparatus can be an ultrasonic floatation table. As will be discussed in more detail subsequently herein, ultrasonic floatation table 2200 of FIG. 1C can be used for supporting substrate 2050, and in conjunction with a Y-axis motion system, can be part of a substrate conveyance system providing for the frictionless conveyance of substrate 2050. A Y-axis motion system of the present teachings can include first Y-axis support beam 2351 and second Y-axis support beam 2352, which can include a gripper system (not shown) for holding a substrate, as will be discussed in more detail herein. Y-axis motion can be provided by either a linear air bearing or linear mechanical system. Ultrasonic floatation table 2200 of printing system 2000 shown in FIG. 1B and FIG. 1C can define the travel of substrate 2050 through gas enclosure 1000 of FIG. 1A during a printing process.

FIG. 1C illustrates generally an example of ultrasonic floatation table 2200 for a printing system 2000 that, in addition to substrate support, can provide floatation during conveyance of a substrate. In the example of FIG. 1C, a handler or other conveyance can be used to position a substrate 2050 in first region 2201 of ultrasonic floatation table 2200, such as located on a conveyor. The conveyer can position the substrate 2050 at a specified location within the printing system such as using either mechanical contact (e.g., using an array of pins, a tray, or a support frame configuration), or using gas cushion to controllably float the substrate 2050 (e.g., using various embodiments of an "air bearing" table configuration). A printing region 2202 of the ultrasonic floatation table 2200 can be used to controllably deposit one or more layers on the substrate 2050 during fabrication. The printing region 2202 can also be coupled to a second region 2203 of the ultrasonic floatation table 2200. The conveyer can extend along the first region 2201, the printing region 2202, and the second region 2203 of the ultrasonic floatation table 2200, and the substrate 2050 can be repositioned as desired for various deposition tasks, or during a single deposition operation. The controlled environments nearby the first region 2201, the printing region 2202, and the second region 2203 can be commonly-shared. According to various embodiments, a substrate can be input into the printing system, or removed from the printing system from, for example, first region 2201, so that the conveyance of a substrate into and out of the printing system may not be linear.

The printing system 2000 of FIG. 1C can include one or more printhead devices 2505, each printhead device having one or more printheads; e.g. nozzle printing, thermal jet or ink-jet type. The one or more printhead devices 2505 can be coupled to or otherwise traversing an overhead carriage, such as first X-axis carriage assembly 2301. For various embodiments of printing system 2000 of the present teachings, one or more printheads of one or more printhead devices 2505 can be configured to deposit one or more patterned organic layers on the substrate 2050 in a "face up" configuration of the substrate 2050. Such layers can include one or more of an electron injection or transport layer, a hole injection or transport layer, a blocking layer, or an emission layer, for example. Such materials can provide one or more electrically functional layers.

Printing requires relative motion between the printhead assembly and the substrate. This can be accomplished with a motion system, typically a gantry or split axis XYZ system. Either the printhead assembly can move over a stationary substrate (gantry style), or both the printhead and substrate can move, in the case of a split axis configuration. In another embodiment, a printhead assembly can be substantially stationary; for example, in the X and Y axes, and the substrate can move in the X and Y axes relative to the printheads, with Z axis motion provided either by a substrate support apparatus or by a Z-axis motion system associated with a printhead assembly. As the printheads move relative to the substrate, droplets of ink are ejected at the correct time to be deposited in the desired location on a substrate. A substrate can be inserted and removed from the printer using a substrate loading and unloading system. Depending on the printer configuration, this can be accomplished with a mechanical conveyor, a substrate floatation table with a conveyance assembly, or a substrate transfer robot with end effector. A printhead management system can be comprised of several subsystems which allow for such measurement tasks, such as the checking for nozzle firing, as well as the measurement of drop volume, velocity and trajectory from every nozzle in a printhead, and maintenance tasks, such as wiping or blotting the inkjet nozzle surface of excess ink, priming and purging a printhead by ejecting ink from an ink supply through the printhead and into a waste basin, and replacement of printheads. Given the variety of components that can comprise an OLED printing system, various embodiments of OLED printing system can have a variety of footprints and form factors.

With respect to FIG. 1C, printing system base 2100, can include first riser 2120 and second riser 2122, upon which bridge 2130 is mounted. For various embodiments of Printing system 2000, bridge 2130 can support first X-axis carriage assembly 2301 and second X-axis carriage assembly 2302, which can control the movement of first printhead assembly 2501 and second printhead assembly 2502, respectively across bridge 2130. For various embodiments of printing system 2000, first X-axis carriage assembly 2301 and second X-axis carriage assembly 2302 can utilize a linear air bearing motion system, which are intrinsically low-particle generating. According to various embodiments of a printing system of the present teachings, an X-axis carriage can have a Z-axis moving plate mounted thereupon. In FIG. 1C, first X-axis carriage assembly 2301 is depicted with first Z-axis moving plate 2310, while second X-axis carriage assembly 2302 is depicted with second Z-axis moving plate 2312. Though FIG. 1C depicts two carriage assemblies and two printhead assemblies, for various embodiments of Printing system 2000, there can be a single carriage assembly and a single printhead assembly. For example, either of first printhead assembly 2501 and second printhead assembly 2502 can be mounted on an X,Z-axis carriage assembly, while a camera system for inspecting features of substrate 2050 can be mounted on a second X,Z-axis carriage assembly. Various embodiments of printing system 2000 can have a single printhead assembly, for example, either of first printhead assembly 2501 and second printhead assembly 2502 can be mounted on an X,Z-axis carriage assembly, while a UV lamp for curing an encapsulation layer printed on substrate 2050 can be mounted on a second X,Z-axis carriage assembly. For various embodiments of Printing system 2000, there can be a single printhead assembly, for example, either of first printhead assembly 2501 and second printhead assembly 2502, mounted on an X,Z-axis carriage assembly, while a heat source for curing an encapsulation layer printed on substrate 2050 can be mounted on a second carriage assembly.

In FIG. 1C, each printhead assembly, such as first printhead assembly 2501 and second printhead assembly 2502 of FIG. 1C, can have a plurality of printheads mounted in at least one printhead device, as depicted in partial view for first printhead assembly 2501, which depicts a plurality of printhead devices 2505. A printhead device can include, for example, but not limited by, fluidic and electronic connections to at least one printhead; each printhead having a plurality of nozzles or orifices capable of ejecting ink at a controlled rate, velocity and size. For various embodiments of printing system 2000, a printhead assembly can include between about 1 to about 60 printhead devices, where each printhead device can have between about 1 to about 30 printheads in each printhead device. A printhead, for example, an industrial inkjet head, can have between about 16 to about 2048 nozzles, which can expel a droplet volume of between about 0.1 pL to about 200 pL.

According to various embodiments of a gas enclosure system of the present teachings, given the sheer number of printhead devices and printheads, first printhead management system 2701 and second printhead management system 2702 can be housed in an auxiliary enclosure, which can be isolated from a printing system enclosure during a printing process for performing various measurement and maintenance tasks with little or no interruption to the printing process. As can be seen in FIG. 1C, first printhead assembly 2501 can be seen positioned relative to first printhead management system 2701 for ready performance of various measurement and maintenance procedures that can be performed by first printhead management system apparatuses 2707, 2709 and 2711. Apparatuses 2707, 2709, and 2011 can be any of a variety of subsystems or modules for performing various printhead management functions. For example apparatuses 2707, 2709, and 2011 can be any of a drop measurement module, a printhead replacement module, a purge basin module, and a blotter module. As depicted in FIG. 1C, first printhead management system 2701 can have apparatuses 2707, 2709 and 2711, which can be mounted on linear rail motion system 2705 for positioning relative to first printhead assembly 2501. Similarly, various apparatuses housed within second printhead management system 2702 can be mounted on linear rail motion system 2706 for positioning relative to first printhead assembly 2502.

With respect to various embodiments of a gas enclosure assembly having an auxiliary enclosure that can be closed off from, as well as sealably isolated from a first working volume, for example, a printing system enclosure, reference is made again to FIG. 1B. As depicted in FIG. 1C, there can be four isolators on Printing system 2000; first isolator set 2110 (second not shown on opposing side) and second isolator set 2112 (second not shown on opposing side), which support ultrasonic floatation table 2200 of printing system 2000. For gas enclosure 1000 of FIG. 1B, first isolator set 2110 and second isolator set 2112 can be mounted in each of a respective isolator well panel, such as first isolator wall panel 1325 and second isolator wall panel 1327 of middle base panel assembly 1320. For gas enclosure 1000 of FIG. 1B, middle base assembly 1320 can include first printhead management system auxiliary panel assembly 1330, as well as second printhead management system auxiliary panel assembly 1370. FIG. 1B of gas enclosure 1000 depicts first printhead management system auxiliary panel assembly 1330 that can include first back wall panel assembly 1338. Similarly, also depicted is second printhead management system auxiliary panel assembly 1370 that can include second back wall panel assembly 1378. First back wall panel assembly 1338 of first printhead management system auxiliary panel assembly 1330 can be constructed in a similar fashion as shown for second back wall panel assembly 1378. Second back wall panel assembly 1378 of second printhead management system auxiliary panel assembly 1370 can be constructed from second back wall frame assembly 1378 having second seal-support panel 1375 sealably mounted to second back wall frame assembly 1378. Second seal-support panel 1375 can have second passage 1365, which is proximal to a second end of base 2100 (not shown). Second seal 1367 can be mounted on second seal-support panel 1375 around second passage 1365. A first seal can be similarly positioned and mounted around a first passage for first printhead management system auxiliary panel assembly 1330. Each passage in auxiliary panel assembly 1330 and auxiliary panel assembly 1370 can accommodate a printhead management system platform, such as first and second printhead management system platforms 2703 and 2704 of FIG. 1C pass through the passages. According to the present teachings, in order to sealably isolate auxiliary panel assembly 1330 and auxiliary panel assembly 1370 the passages, such as second passage 1365 of FIG. 1B must be sealable. It is contemplated that various seals, such as an inflatable seal, a bellows seal and a lip seal can be used for sealing a passage, such as second passage 1365 of FIG. 1B, around a printhead management system platform affixed to a printing system base.

First printhead management system auxiliary panel assembly 1330 and second printhead management system auxiliary panel assembly 1370 can include first printhead assembly opening 1342 of first floor panel assembly 1341 and second printhead assembly opening 1382 of second floor panel assembly 1381; respectively. First floor panel assembly 1341 is depicted in FIG. 1B as part of first middle enclosure panel assembly 1340 of middle panel assembly 1300. First floor panel assembly 1341 is a panel assembly in common with both first middle enclosure panel assembly 1340 and first printhead management system auxiliary panel assembly 1330. Second floor panel assembly 1381 is depicted in FIG. 1B as part of second middle enclosure panel assembly 1380 of middle panel assembly 1300. Second floor panel assembly 1381 is a panel assembly in common with both second middle enclosure panel assembly 1380 and second printhead management system auxiliary panel assembly 1370.

As previously discussed herein, first printhead assembly 2501 can be housed in first printhead assembly enclosure 2503, and second printhead assembly 2502 can be housed in second printhead assembly enclosure 2504. According to systems and methods of the present teachings, first printhead assembly enclosure 2503 and second printhead assembly enclosure 2504 can have an opening at the bottom that can have a rim (not shown), so that various printhead assemblies can be positioned for printing during a printing process. Additionally, the portions of first printhead assembly enclosure 2503 and second printhead assembly enclosure 2504 forming a housing can be constructed as previously described for various panel assemblies, so that the frame assembly members and panels are capable of providing an hermetically-sealed enclosure.

A compressible gasket which can additionally be used for the hermetic sealing of various frame members, can be affixed around each of first printhead assembly opening 1342 and second printhead assembly opening 1382, or alternatively around the rim of first printhead assembly enclosure 2503 and second printhead assembly enclosure 2504.

According to the present teachings, compressible gasket material can be selected from, for example, but not limited by, any in the class of closed-cell polymeric materials, also referred to in the art as expanded rubber materials or expanded polymer materials. Briefly, a closed-cell polymer is prepared in a fashion whereby gas is enclosed in discrete cells; where each discrete cell is enclosed by the polymeric material. Properties of compressible closed-cell polymeric gasket materials that are desirable for use in gas-tight sealing of frame and panel components include, but are not limited by, that they are robust to chemical attack over a wide range of chemical species, possess excellent moisture-barrier properties, are resilient over a broad temperature range, and they are resistant to a permanent compression set. In general, compared to open-cell-structured polymeric materials, closed-cell polymeric materials have higher dimensional stability, lower moisture absorption coefficients, and higher strength. Various types of polymeric materials from which closed-cell polymeric materials can be made include, for example, but not limited by, silicone, neoprene, ethylene-propylene-diene terpolymer (EPT); polymers and composites made using ethylene-propylene-diene-monomer (EPDM), vinyl nitrile, styrene-butadiene rubber (SBR), and various copolymers and blends thereof.

In addition to close-cell compressible gasket materials, another example of a class of compressible gasket material having desired attributes for use in constructing embodiments of a gas enclosure assembly according to the present teachings includes the class of hollow-extruded compressible gasket materials. Hollow-extruded gasket materials as a class of materials have the desirable attributes, including, but not limited by, that they are robust to chemical attack over a wide range of chemical species, possess excellent moisture-barrier properties, are resilient over a broad temperature range, and they are resistant to a permanent compression set. Such hollow-extruded compressible gasket materials can come in a wide variety of form factors, such as for example, but not limited by, U-cell, D-cell, square-cell, rectangular-cell, as well as any of a variety of custom form factor hollow-extruded gasket materials. Various hollow-extruded gasket materials can be fabricated from polymeric materials that are used for closed-cell compressible gasket fabrication. For example, but not limited by, various embodiments of hollow-extruded gaskets can be fabricated from silicone, neoprene, ethylene-propylene-diene terpolymer (EPT); polymers and composites made using ethylene-propylene-diene-monomer (EPDM), vinyl nitrile, styrene-butadiene rubber (SBR), and various copolymers and blends thereof. Compression of such hollow cell gasket materials should not exceed about 50% deflection in order to maintain the desired attributes. It is contemplated that various types of inflatable seals can be utilized for sealing a printhead assembly using first printhead assembly docking gasket 1345 and second printhead assembly docking gasket 1385. Such inflatable seals may provide rapid sealing and unsealing during processing, as well as being fabricated from low-contamination materials, such as low particle generating, low outgassing polymeric materials, such as silicones, neoprenes and butyl rubber materials.

As depicted in FIG. 1B, first printhead assembly docking gasket 1345 and second printhead assembly docking gasket 1385 can be affixed around first printhead assembly opening 1342 and second printhead assembly opening 1382, respectively. During various printhead measurement and maintenance procedures, first printhead assembly 2501 and second printhead assembly 2502 can be positioned by first X,Z-axis carriage assembly 2301 and second X,Z-axis carriage assembly 2302, respectively, over first printhead assembly opening 1342 of first floor panel assembly 1341 and second printhead assembly opening 1382 of second floor panel assembly 1381, respectively. In that regard, for various printhead measurement and maintenance procedures, first printhead assembly 2501 and second printhead assembly 2502 can be positioned over first printhead assembly opening 1342 of first floor panel assembly 1341 and second printhead assembly opening 1382 of second floor panel assembly 1381, respectively, without covering or sealing first printhead assembly opening 1342 and second printhead assembly opening 1382. First X,Z-axis carriage assembly 2301 and second X,Z-axis carriage assembly 2302 can dock first printhead assembly enclosure 2503 and second printhead assembly enclosure 2504, respectively, with first printhead management system auxiliary panel assembly 1330 and second printhead management system auxiliary panel assembly 1370, respectively. In various printhead measurement and maintenance procedures, such docking may effectively close first printhead assembly opening 1342 and second printhead assembly opening 1382 without the need for sealing first printhead assembly opening 1342 and second printhead assembly opening 1382. For various printhead measurement and maintenance procedures, the docking can include the formation of a gasket seal between each of the printhead assembly enclosures and the printhead management system panel assemblies. In conjunction with sealably closing passages, such as second passage 1365 and a complementary first passage of FIG. 1B, when first printhead assembly enclosure 2503 and second printhead assembly enclosure 2504 are docked with first printhead management system auxiliary panel assembly 1330 and second printhead management system auxiliary panel assembly 1370 to sealably close first printhead assembly opening 1342 and second printhead assembly opening 1382, the combined structures so formed are hermetically sealed.

Additionally, according to the present teachings, an auxiliary enclosure can be isolated from, for example, another interior enclosure volume, such as the printing system enclosure, as well as the exterior of a gas enclosure assembly, by using a structural closure to sealably close a passageway, such as first printhead assembly opening 1342 and second printhead assembly opening 1382 of FIG. 1B. According to the present teachings, a structural closure can include a variety of sealable coverings for an opening or passageway; such opening or passageway including non-limiting examples of an enclosure panel opening or passageway. According to systems and methods of the present teachings, a gate can be any structural closure that can be used to reversibly cover or reversibly sealably close any opening or passageway using pneumatic, hydraulic, electrical, or manual actuation. As such, first printhead assembly opening 1342 and second printhead assembly opening 1382 of FIG. 1B can be reversibly covered or reversibly sealably closed using a gate.

In the expanded view of printing system 2000 of FIG. 1C, various embodiments of a printing system can include ultrasonic floatation table 2200, supported by substrate floatation table base 2220. Substrate floatation table base 2220 can be mounted on printing system base 2100. Ultrasonic floatation table 2200 of OLED printing system can support substrate 2050, as well as defining the travel over which substrate 2050 can be moved through gas enclosure 1000 during the printing of an OLED substrate. A Y-axis motion system of the present teachings can include first Y-axis support beam 2351 and second Y-axis support beam 2352, which can include a gripper system (not shown) for holding a substrate, which will be discussed in more detail herein. Y-axis motion can be provided by either a linear air bearing or linear mechanical system. In that regard, in conjunction with a motion system; as depicted in FIG. 1C, a Y-axis motion system, ultrasonic floatation table 2200 can provide frictionless conveyance of substrate 2050 through a printing system.

Figure 2A:
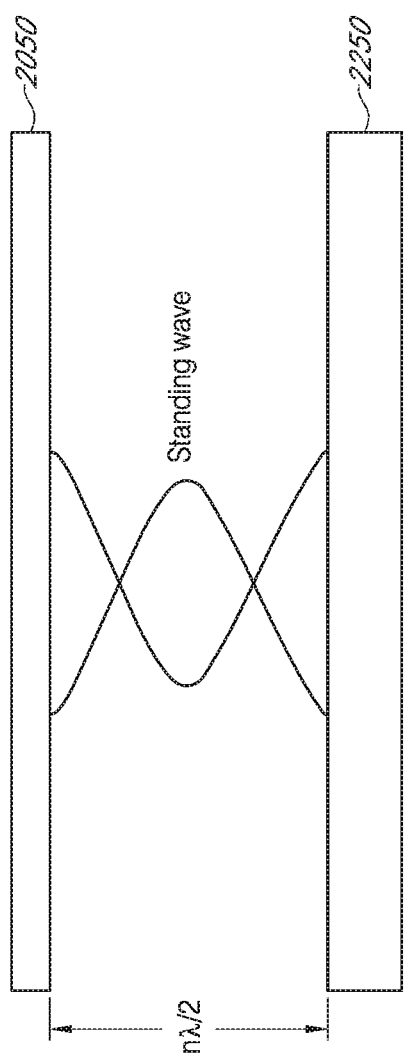
FIG. 2A through FIG. 2C are a schematic section views of a substrate levitated with respect to various embodiments of an ultrasonic floatation table according to the present teachings.

According to the present teachings, a substrate may be supported on a gas cushion formed using an ultrasonic floatation table. Without being bound by theory, as depicted in FIG. 2A, in various embodiments of an ultrasonic floatation table, a gas cushion that separates substrate 2050 from sound radiator 2250 of ultrasonic floatation table 2200 (see FIG. 1C) can have a gap that is an integer value of a standing wave formed in half wavelengths from a radiation source. According to various embodiments of, a gas cushion that separates substrate 2050 from sound radiator 2250 of an ultrasonic floatation table can have a gap that is substantially smaller than the wavelength of a sound wave emanating from a radiation source. According to various embodiments of the present teachings, the gap between substrate 2050 and sound radiator 2250 can be from about 50 microns to about 300 microns.

Figure 2C:
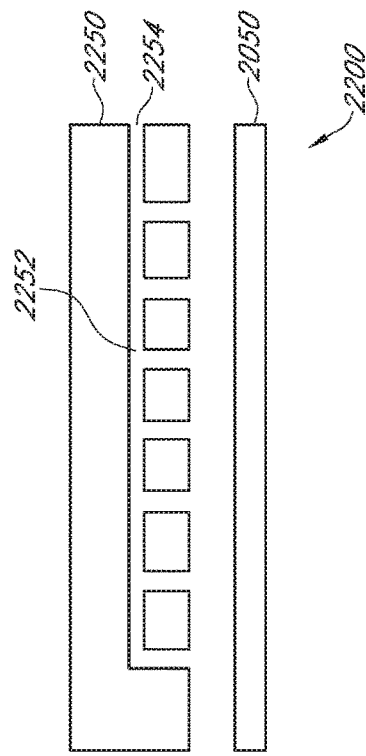
Figure 2B:
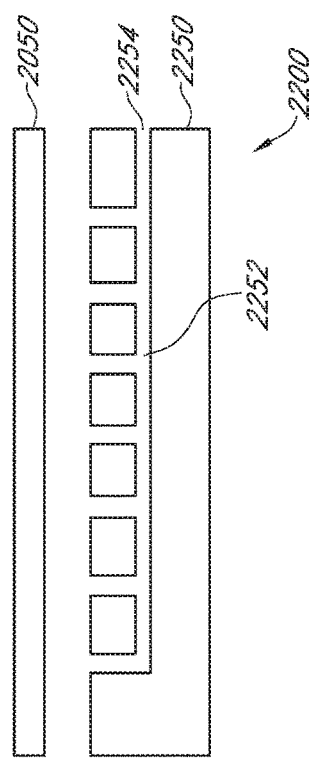

As depicted in in FIG. 2B and FIG. 2C, substrate 2050 can be levitated relative to ultrasonic floatation table 2200, in which sound radiator 2250 can include vacuum manifold 2252 for providing a selected low pressure preload in order to enhance stiffness. Vacuum manifold 2250 can have vacuum port 2254, which can be in flow communication with a vacuum source that can be regulated for providing a targeted low-pressure preload. For various embodiments of an ultrasonic floatation table of the present teachings, sound radiator 2250 can have a series of vacuum ports formed to fabricate vacuum manifold 2252, while in other embodiments a porous can be used to provide an evenly distributed and controllable low pressure over the surface of sound radiator 2250. For various embodiments of an ultrasonic floatation table of the present teachings that utilize a vacuum preload, substrate 2050 can be levitated over ultrasonic floatation table 2200 in a face-up orientation, as depicted in FIG. 2B. For various embodiments of an ultrasonic floatation table of the present teachings utilizing a vacuum preload, substrate 2050 can be levitated under ultrasonic floatation table 2200 in a face-down orientation, as depicted in FIG. 2C.

Figure 3:
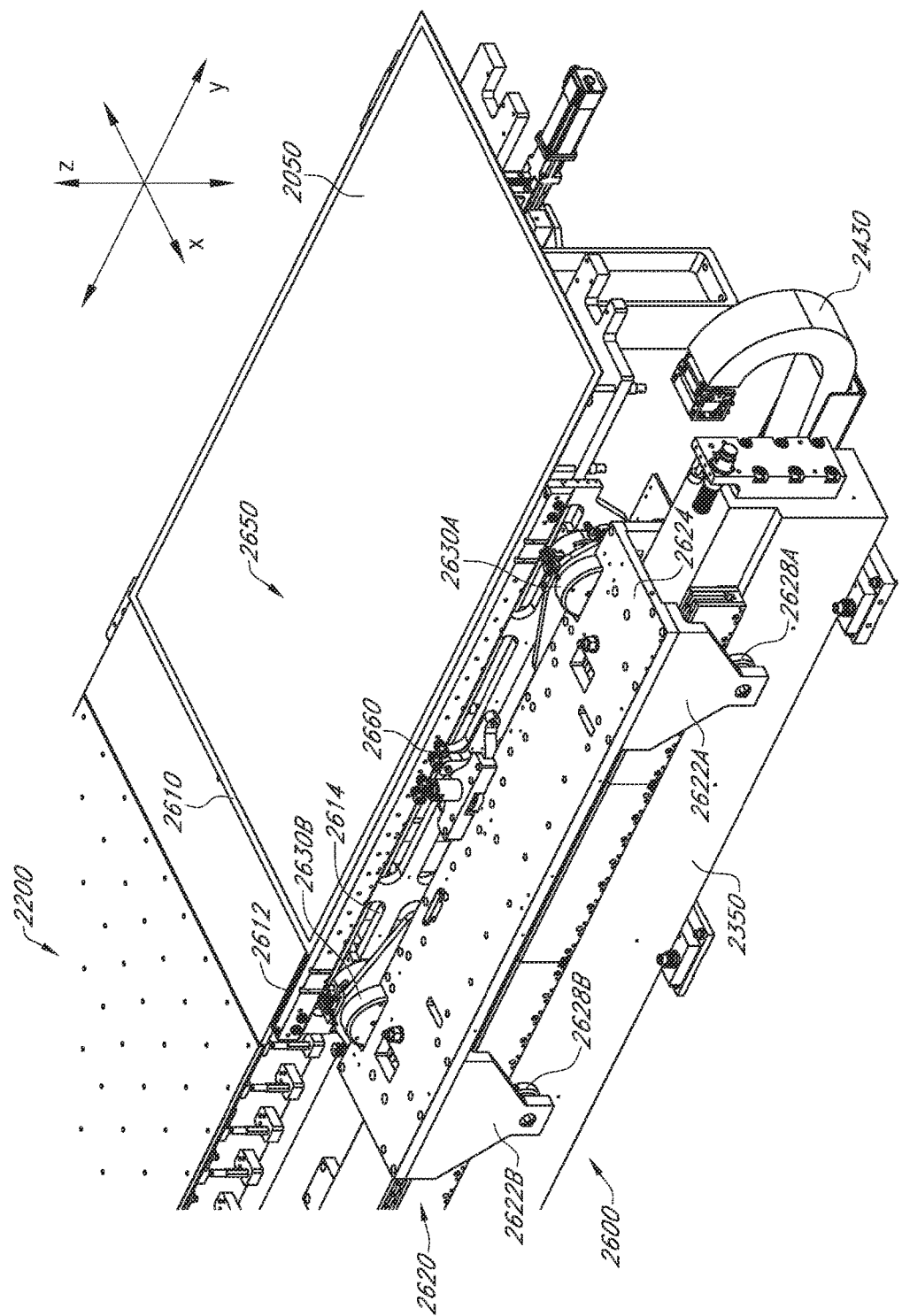
FIG. 3 is an expanded iso view of a printing system according to the present teaching, showing a Y-axis motion system.

FIG. 3 depicts a Y-axis motion system according to the present teachings, depicted in FIG. 3 as mounted upon Y-axis beam 2350, which can be, for example, a granite beam. As depicted in the coordinate system, a substrate, such as 2050, which is mounted on ultrasonic floatation table 2200, can travel in a +/−Y-axis direction. Ultrasonic floatation table 2200 provides frictionless, low-particle generating substrate support of substrate 2050 with precision Z-axis positioning, while Y-axis motion system 2600 provides frictionless, low-particle Y-axis conveyance of substrate 2050 relative to a printhead assembly, such as printhead assembly 2501 of FIG. 1C.

Various embodiments of low-particle generating Y-axis motion systems of the present teachings utilized in conjunction with a floatation table can be compared to, for example, a chuck mounted on a large turntable. In the case of a chuck mounted on a large turntable, large motors would be required in the operation of the large turntable, which would result in significant heat dissipation, as well as particle generation due to the movement of solid parts against solid parts. In the case of various embodiments of a gripper system of the present teachings, the only inertia in the system is the mass of a substrate and the gripper assembly, so that any linear motor required for Y-axis movement is substantially smaller than for a chuck mounted on a turntable.

Moreover, the inventors have discovered that Y-axis beam 2350, even though manufactured to provide surfaces that are both flat and parallel to a high degree, may produce excursions in travel that may be unacceptable for the intended use for the precision of orientation of a substrate with respect to the theta-Z ($\theta$-Z) axis during Y-axis travel. For example, but not limited by, printing an ink into a pixel of an OLED device substrate is a process requiring precision orientation of a substrate in the axis of travel for which a beam manufactured to high tolerances of flatness and parallelism may still produce unacceptable excursions in substrate orientation during travel. As such, various embodiments of a Y-axis motion system 2600 of the present teachings utilizing an air bearing motion system for conveying Y-axis carriage assembly 2620 can provide reliable, accurate low-particle generating Y-axis conveyance of a substrate, providing operation at high speed with fast acceleration and deceleration, as well as obviating the need for dissipation of excess heat contamination in a gas enclosure system. Additionally, gripper motion control assembly 2650 of Y-axis motion system 2600 can provide dynamic rotation of the orientation of a substrate about the theta-Z ($\theta$-Z) axis during Y-axis travel to maintain a high degree of precision for substrate orientation parallel to the axis of travel. Accordingly, gripper motion control assembly 2650 of Y-axis motion system 2600 can maintain substrate orientation with a high degree of precision parallel to the Y-axis direction of travel in a horizontal plane determined, for example, by the fly height of a substrate.

As shown in FIG. 3, various embodiments of linear Y-axis motion system 2600 can include substrate gripper assembly 2610, Y-axis carriage assembly 2620, as well as gripper motion control assembly 2650. In FIG. 3, gripper assembly 2610, can include a substrate gripping surface, for example, but not limited by, such as vacuum chuck bar 2612, which can be supported on substrate gripper frame 2614. Substrate gripper frame 2614 can be mounted to Y-axis carriage assembly 2620 of a Y-axis motion system assembly 2600. In FIG. 3, first air-bearing puck 2628A and second air-bearing puck 2628B of Y-axis carriage assembly 2620 are indicated mounted to first saddle arm 2622A and second saddle arm 2622B, respectively, which are part of a plurality of air-bearings supporting Y-axis carriage assembly 2620. Y-axis carriage assembly 2620 can be translated in a +/−Y-axis direction using a brushless linear motor. As will be discussed in more detail subsequently herein, gripper motion control assembly 2650 can utilize a dual voice coil motor assembly, such as voice coil motor assemblies, 2630A and 2630B, as well as pivot assembly 2660. Various embodiments of a gripper motion control assembly can include at least one voice coil motor and air bushing center pivot in conjunction with a position sensor and motion controller. Various embodiments of a Y-axis motion system of the present teachings based on voice coil motors are highly reliable, and can provide orientation accuracies of less than one micron. Additionally, the direct coupling of the substrate to such a gripper assembly of a Y-axis motion system allows for frictionless high speed operation with fast acceleration, as well as fast deceleration, using a linear brushless motor for the conveyance of Y-axis carriage assembly 2620, as well as dynamic rotation of the orientation of a substrate about the theta-Z ($\theta$-Z) axis during Y-axis travel using gripper motion control assembly 2650 to maintain a high degree of precision for substrate orientation parallel to the axis of travel. As such, various embodiments of a Y-axis motion system utilizing an air-bearing gripper system can provide precision low-particle generating conveyance of substrate 2050 supported on ultrasonic floatation table 2200 through a printing system, such as printing system 2000 of FIG. 1C. Such a frictionless Y-axis motion system for moving a substrate can utilize either one or two Y-axis rails. Service bundle carrier 2430 can be used for the management of various service bundles, which can include, for example, but not limited by optical cables, electrical cables, wires, tubing and the like. Various embodiments of service bundles according to the present teachings can be connected to a printing system to provide various optical, electrical, mechanical and fluidic connections required to operate a functioning printing system.

Figure 4A:
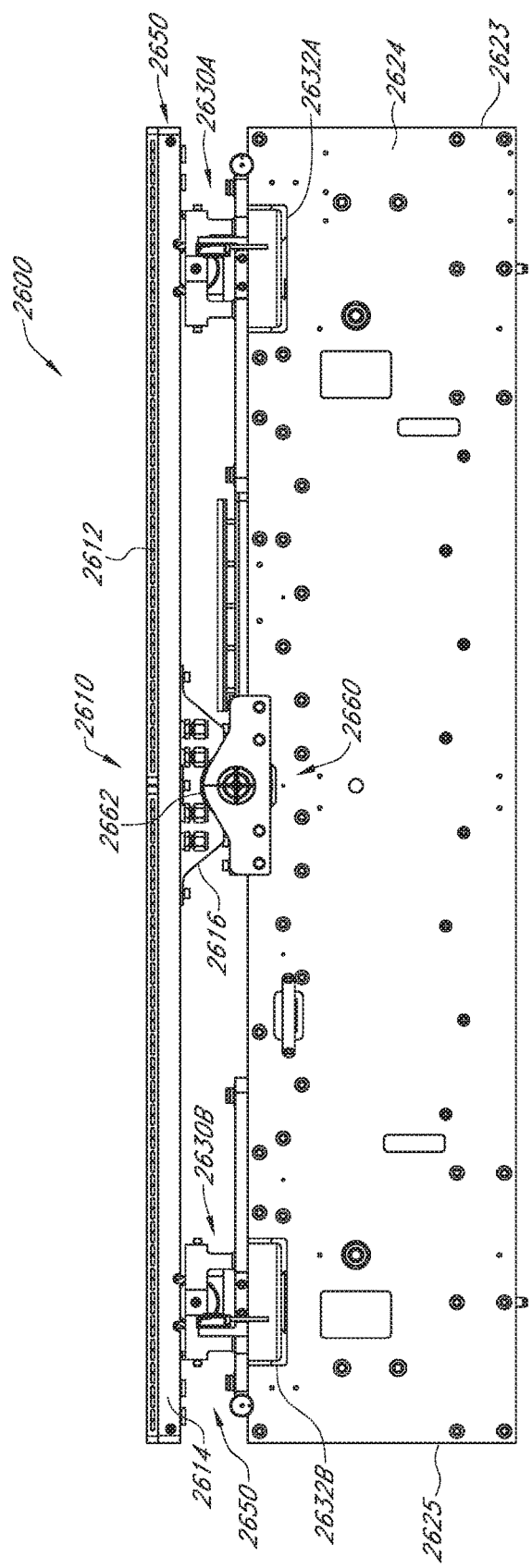
FIG. 4A is a top view of a Y-axis motion system according to various embodiments of systems and methods of the present teachings.
Figure 4B:
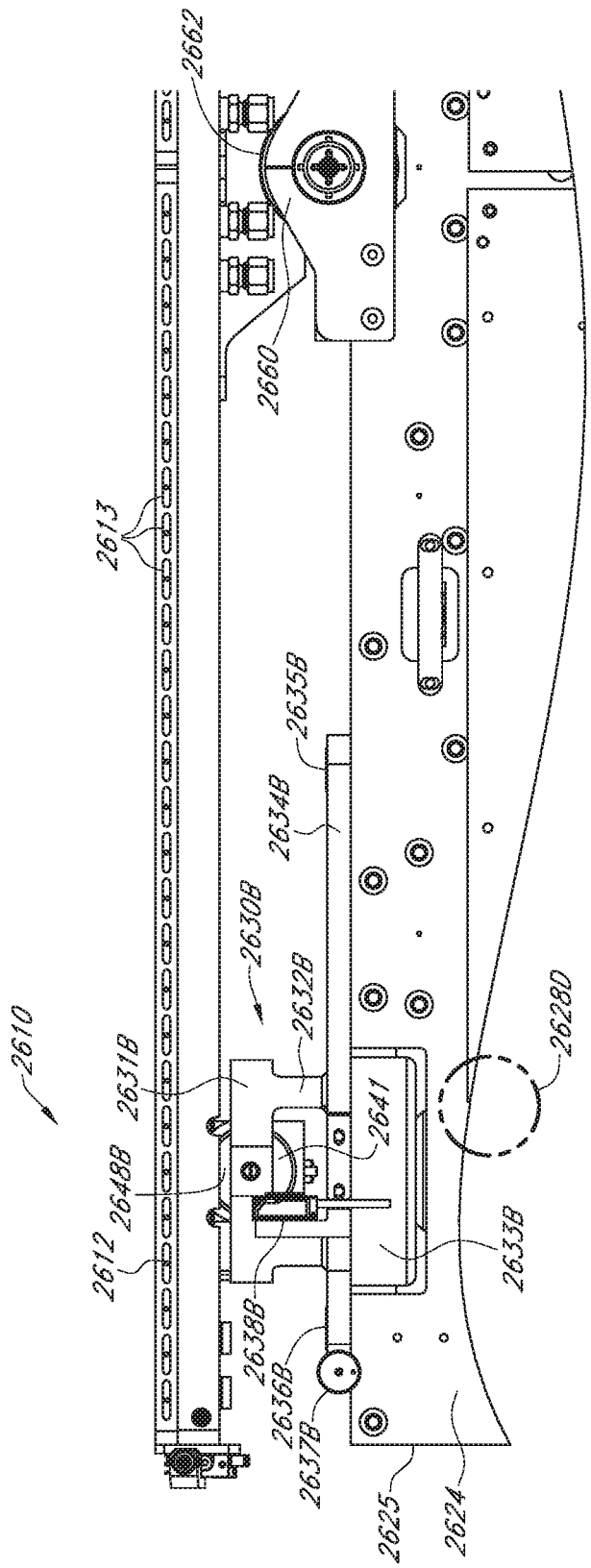
FIG. 4B is an expanded partial top view of FIG. 4A.

FIG. 4A is a top view of Y-axis motion system 2600, showing gripper assembly 2610, Y-axis carriage assembly top plate 2624, and gripper motion control assembly 2650. Gripper assembly 2610 can include vacuum chuck bar 2612, mounted on gripper frame 2614. Y-axis carriage assembly top plate 2624 is depicted in FIG. 4A having first end 2623 and second end 2625. Gripper assembly 2610 and Y-axis carriage assembly 2620 can be adjoined through the subassemblies of gripper motion control assembly 2650. For example, first voice coil assembly 2630A and second voice coil assembly 2630B have first and second voice coil housing 2632A and 2623B, respectively, which can be secured to Y-axis carriage assembly 2620 on one side of the voice coil assembly housing and to gripper assembly 2610 on the opposing side of the voice coil housing. Additionally, center pivot 2660 can include air bearing housing 2662, which can be secured to boss 2616 of gripper assembly 2610. FIG. 4B is a partial top view of air-bearing Y-axis motion system 2600 of FIG. 4A, depicting an expanded top view of second end 2625 of Y-axis motion system 2600. In FIG. 4B, an expanded top view of gripper assembly 2610, as well as an expanded top view of voice coil assembly 2630B are particularly apparent. Various embodiments of vacuum chuck bar 2612 mounted on gripper frame 2614 can include a plurality of vacuum sockets 2613, of which three of the plurality are indicated in FIG. 4B. Vacuum sockets 2613 are spaced at intervals along the length of vacuum chuck bar 2612, so that vacuum chuck bar 2612 can readily engage and release a substrate obviating the need for two-sided mechanical gripping of a substrate, such as that of a 2-fingered or 3-fingered gripping device. In addition to first air-bearing puck 2628A and second air-bearing puck 2628B of FIG. 3 for supporting Y-axis carriage assembly 2620, second upper puck 2628D can be mounted to the underside of Y-axis carriage assembly top plate 2624 (see FIG. 3 and FIG. 4B). A first upper puck (not shown) can be mounted symmetrically under the opposing first end 2623 of Y-axis carriage assembly top plate 2624 proximal to first saddle arm 2622A (see FIG. 4A).

As will be discussed in more detail herein, in addition to air-bearing pucks for supporting Y-axis carriage assembly 2620, voice coil air-bearing 2641 of second voice coil assembly 2630B depicted in FIG. 4B, along with a voice coil air-bearing (not shown) associated with first voice coil assembly 2630A (see FIG. 4A) can be utilized for the vertical stabilization of gripper assembly 2610. In the top view rendering of FIG. 4B, a single air bearing is visible. As a preload of a voice coil air-bearing in voice coil assembly, such as voice coil assembly 2630A and 2630B of FIG. 4A can ensure a requisite system stiffness. As depicted in the top view of FIG. 4B, various embodiments of a Y-axis motion system of the present teaching can include a single air bearing. Various embodiments of systems and methods utilizing a single air bearing in a voice coil assembly can preload the air bearing using, for example, but not limited by, gravity, vacuum or magnetic preload. Various embodiments of a Y-axis motion system may utilize an opposing second air bearing to provide bearing preload. Various embodiments of a voice coil motor assembly of the present teachings, such voice coil assembly 2630B of FIG. 4B, can include voice coil housing 2633B that can be adjoined to Y-axis carriage 2620. As will be discussed in more detail herein, voice coil gripper frame mounting block 2648B of voice coil assembly 2630B can be used to affix a voice coil assembly to gripper frame 2614. Voice coil assembly 2630B can also include voice coil shaft 2634B, which can have pivot screw 2635B and holding screw 2636B, as well as set screw 2637B. Additionally, voice coil assembly 2630B can have linear encoder 2638B. Finally, center pivot 2660 is an air-bushing that is configured to provide an axis of rotation for reliable and accurate theta-Z (θ-Z) rotation for embodiments of gripper motion control system 2650 of the present teachings. Though the parts of voice coil assembly 2630B have been described, voice coil assembly 2630A can be similarly described.

Figure 5A:
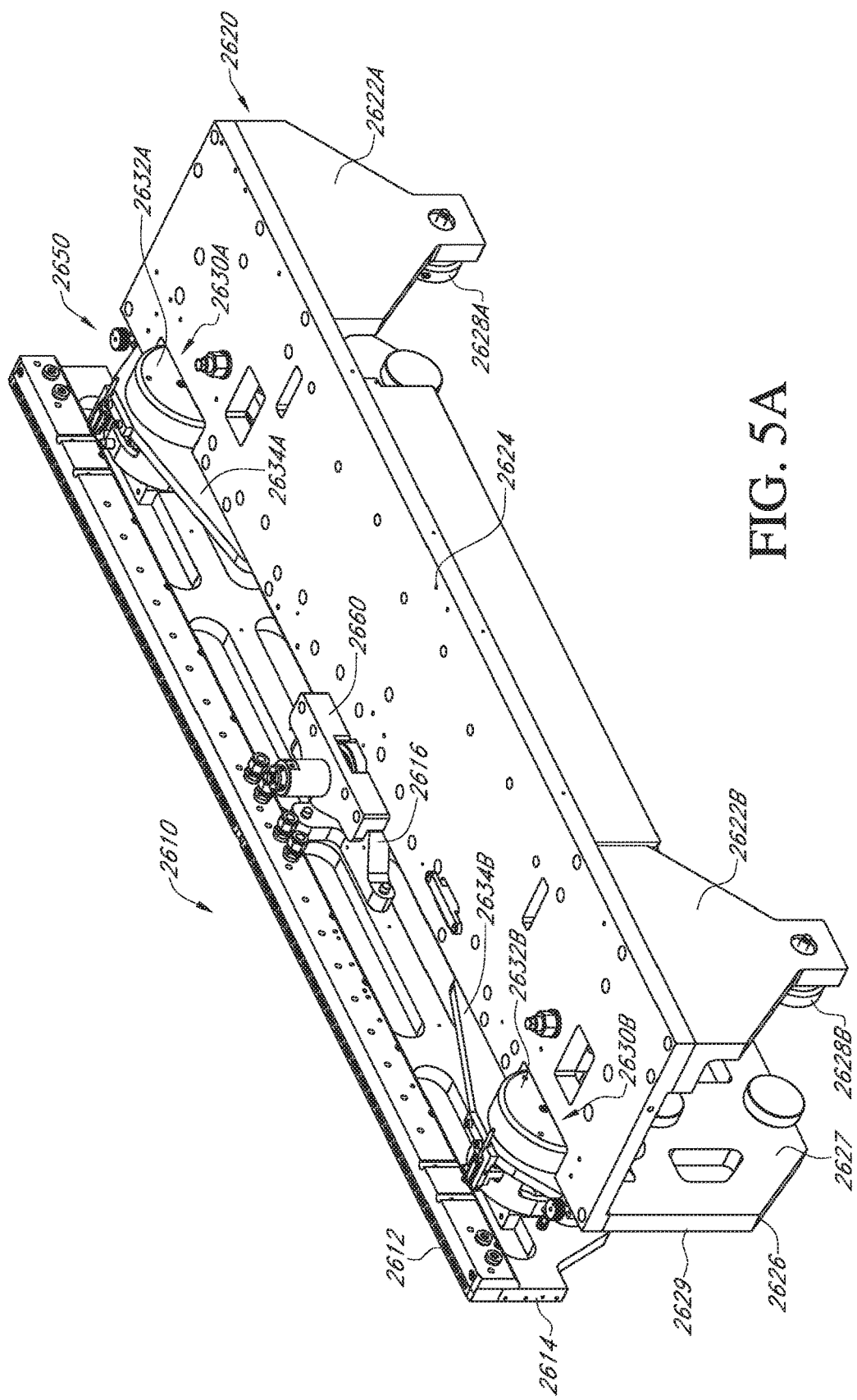
FIG. 5A is an iso view of a Y-axis motion system according to various embodiments of systems and methods of the present teachings.

FIG. 5A is an isometric view of a carriage assembly, gripper motion control assembly, and gripper assembly of a Y-axis motion system according to various embodiments of systems and methods of the present teachings. As depicted in FIG. 5A FIG. 5A depicts Y-axis carriage assembly 2620 with first and second saddle arms 2622A and 2622B, respectively; the saddle arms having first puck 2628A and second puck 2628B mounted thereupon, respectively; so that the pucks are proximal to Y-axis beam 2350 (see FIG. 3). First and second saddle arms 2622A and 2622B, as well as Y-axis carriage assembly side frame 2626 can be joined to Y-axis carriage assembly top plate 2624. Y-axis carriage assembly side frame 2626 can have first side 2627, which is proximal to Y-axis beam 2350 (see FIG. 3), and second side 2629, which is proximal to gripper frame 2614. Gripper motion control assembly 2650 can include first and second voice coil assemblies, 2630A and 2630B, respectively, as well as center pivot assembly 2660. As previously discussed herein, gripper motion control assembly 2650 is adjoined to both the Y-axis carriage assembly 2620 and the gripper assembly 2610; effectively adjoining the Y-axis carriage assembly and gripper assembly thereby (see also FIG. 4B). As a substrate, such as substrate 2050 of FIG. 3, is held by vacuum chuck bar 2612 mounted to gripper frame 2614, dynamic angular (θ-Z) adjustment to offset the effects of imperfections in a Y-axis beam can be done for a substrate by gripper motion control assembly 2650 as Y-axis carriage assembly 2620 travels over Y-axis beam 2350 (see FIG. 3). Accordingly, a substrate during Y-axis travel can be maintained with high precision with respect the orientation of a substrate about the theta-Z (θ-Z) axis during Y-axis travel using gripper motion control assembly 2650 to maintain a high degree of precision for substrate orientation parallel to the axis of travel. Various embodiments of gripper motion control assembly 2650 can maintain the orientation of a substrate parallel to the Y-axis of travel to within +/−4300 microradians. Accordingly, gripper motion control assembly 2650 of Y-axis motion system 2600 can maintain substrate orientation with a high degree of precision parallel to the Y-axis direction of travel in a horizontal plane determined, for example, by the fly height of a substrate.

Figure 5B:
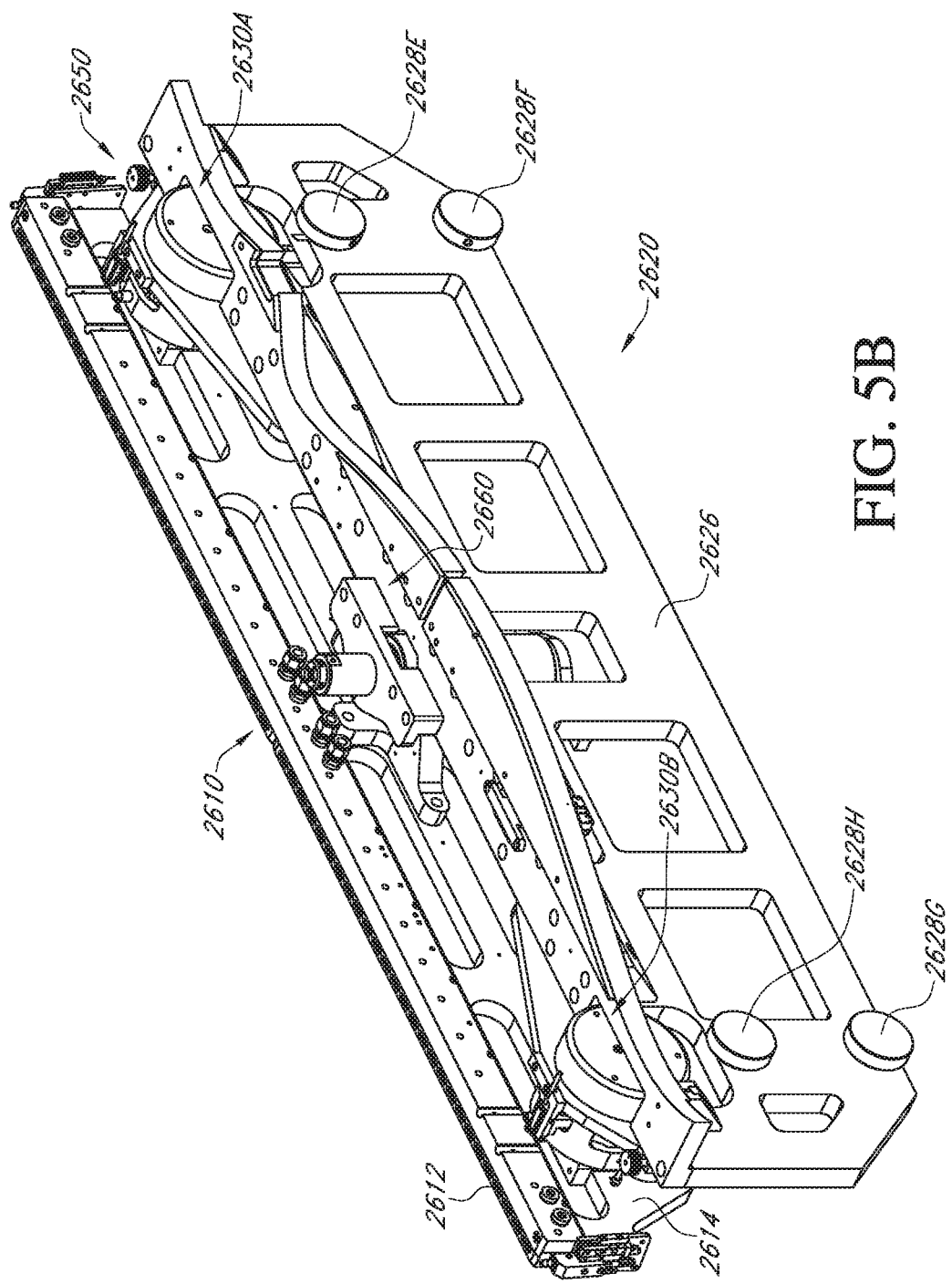
FIG. 5B is a long section view of FIG. 5A.

FIG. 5B depicts a long section perspective view through Y-axis carriage assembly 2620 of FIG. 5A, which illustrates generally gripper assembly 2610 mounted to Y-axis carriage assembly 2620. In FIG. 5B, first and second voice coil motor assemblies, 2630A and 2630B, respectively, as well as vacuum chuck bar 2612 on gripper frame 2614, and center pivot 2660 are indicated. In FIG. 3 and FIG. 5A, first air-bearing puck 2628A and second air-bearing puck 2628B of Y-axis carriage assembly 2620 are indicated. In FIG. 4B, a first and second air-bearing puck under Y-axis carriage assembly top plate 2624 were described. As shown in FIG. 5B, Y-axis carriage assembly side frame 2626 can have a plurality of air-bearing pucks mounted thereupon, such as air-bearing pucks 2628E through 2640H. In addition to the air bearing pucks located on the saddle arms and top plate of a carriage assembly proximal to Y-axis beam 2350, a plurality of air-bearing pucks mounted on Y-axis carriage assembly side frame 2626 can provide bearing support between side frame 2626 and the corresponding side of Y-axis beam 2350. Various embodiments of a Y-axis motion system of the present teaching, for example, as generally illustrated in FIG. 3 through FIG. 5B can provide for a low-particle generating, low heat-generating conveyance of substrate through a printing system.

Figure 6:
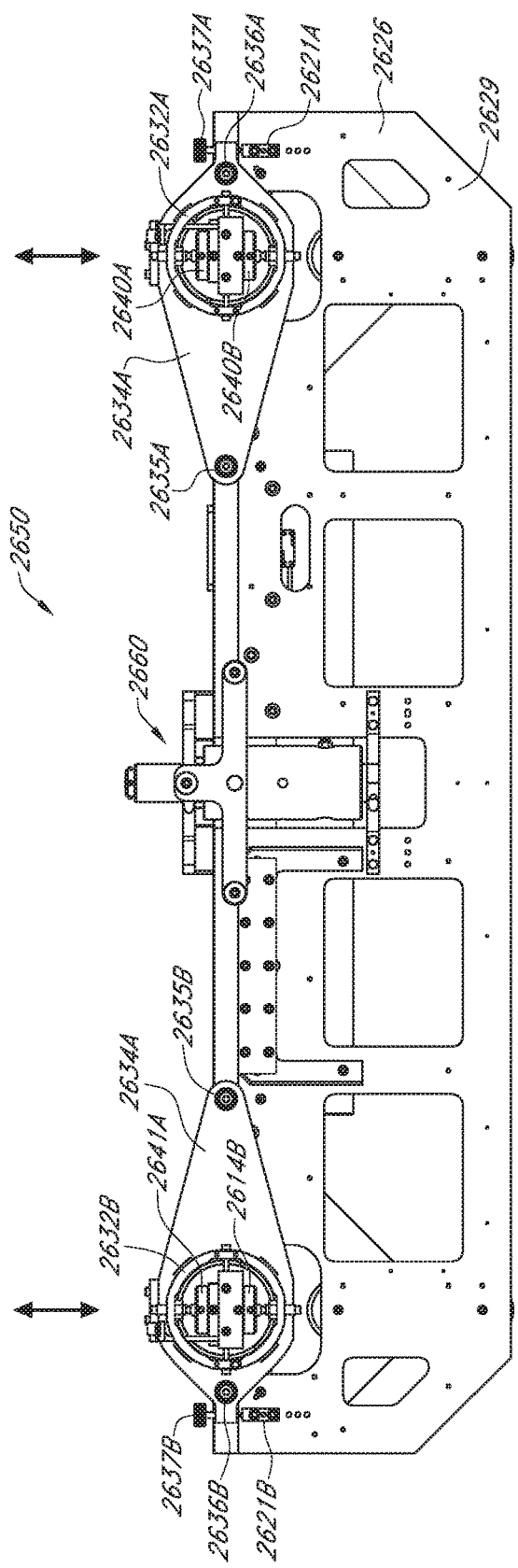
FIG. 6 is side view of a carrier assembly side frame with a gripper motion control assembly mounted thereupon.

FIG. 6 depicts the second side 2627 of Y-axis carriage assembly side frame 2626, which is the side proximal to gripper frame 2614, and illustrates generally a Y-axis moving system subassembly including gripper motion control assembly 2650 without gripper frame 2614 mounted. First and second voice coil assemblies 2630A and 2630B can be mounted at opposing top ends of second side 2627 of Y-axis carriage assembly side frame 2626, while center pivot 2660 can be mounted in the top center portion of second side 2627 of Y-axis carriage assembly side frame 2626. First and second voice coil assemblies 2630A and 2630B can include first voice coil assembly shaft 2634A and second voice coil assembly shaft 2634B, respectively, as well as first voice coil assembly housing 2632A and second voice coil assembly housing 2632B. Each of first voice coil assembly shaft 2634A and second voice coil assembly shaft 2634B can have a set screw; first voice coil assembly set screw 2635A and second voice coil assembly set screw 2637B, respectfully, each set screw having a shank extending into voice coil assembly set screw hole 2621A and 2621B, respectively. Additionally, as depicted in FIG. 6, each voice coil assembly shaft; first voice coil assembly shaft 2634A and second voice coil assembly shaft 2634B can have a pivot screw and a holding screw; pivot screw 2635A and holding screw 2636A for first voice coil assembly shaft 2634A and pivot screw 2635B and holding screw 2636B for first voice coil assembly shaft 2634B. For the initial adjustment of the horizontal position of a gripper assembly and substrate relative to a floatation table, for both first and second voice coil assemblies 2630A and 2630B, the pivot screw and holding screw can be loosened, until the horizontal position of gripper assembly and substrate are correctly adjusted, and then the pivot screw and holding screw are tightened. Adjusting voice coil assemblies 2630A and 2630B equally can be done to make an adjustment in a gripper assembly's position in +/−Z relative to a floatation table (see FIG. 3), while adjusting voice coil assemblies 2630A and 2630B unequally can be done to make an adjustment in a gripper assembly's position in theta-X (θ-X) relative to a floatation table (see FIG. 3). As previously discussed herein, various embodiments of voice coil assemblies of the present teachings utilize a pair of air bearings, which an upper or top air bearing, such as air bearing 2640A of first voice coil assembly 2630A and air bearing 2641A of second voice coil assembly 2630B, as well as an opposing bottom air bearing, such as air bearing 2640B of first voice coil assembly 2630A and air bearing 2641B of second voice coil assembly 2630B. Each bottom air bearing is used to preload each upper or top air bearing.

Figure 7A:
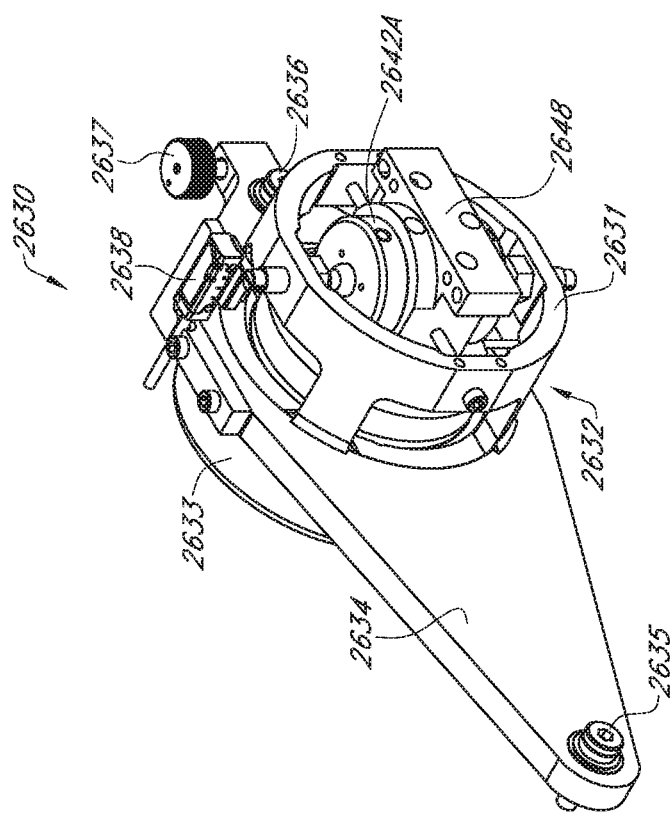
FIG. 7A is an iso view of a voice coil assembly according to various embodiments of systems and methods of the present teachings.
Figure 7B:
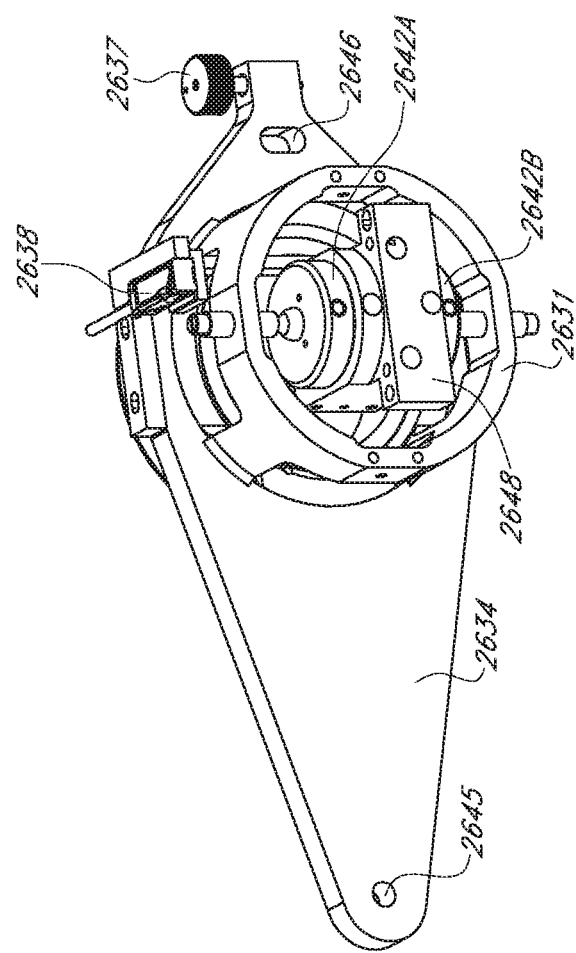
FIG. 7B is a side view of a voice coil assembly.

FIG. 7A illustrates generally an isometric view of a voice coil assembly according to the present teachings. A voice coil assembly can include a voice coil housing 2632, which can have first voice coil housing side first 2631 and opposing voice coil housing second side 2633, as well as voice coil shaft 2634. Voice coil shaft 2634 can include pivot screw 2635 and holding screw 2636, as well as set screw 2637, all of which can be used in the initial vertical adjustment of the of a gripper assembly relative to a flotation table, as previously discussed herein with respect to FIG. 6. In FIG. 7B, pivot screw 2635 and holding screw 2636 have been removed, so that pivot through hole 2645, which accommodates pivot screw 2635, and through slot 2646, which accommodates holding screw 2636, are apparent. Voice coil assembly 2630 can have a pair of air bearings such as upper air bearing 2642A and opposing or lower air bearing 2642B, for which the lower air bearing is used to preload the upper air bearing. Voice coil assembly 2630 can include voice coil gripper frame mounting block 2648, which can be used to affix a voice coil assembly to a gripper frame (see FIG. 4B). Additionally, a voice coil assembly of the present teachings can include liner encoder 2638, which is oriented in the X direction. Various embodiments of a Y-axis motion system of the present teachings utilize a linear encoder head that allows the voice coils to be oriented within 1-2 microns in the X direction relative to a carriage assembly, providing for dynamic adjustment in theta-Z (θ-Z) during the conveyance of a substrate on a Y-axis beam utilizing various embodiments of a Y-axis motion system of the present teachings. Additionally, for various embodiments of gripper motion control assembly 2650 of FIG. 6, a master-slave control system can be used for controlling the first voice coil assembly 2630A and second voice coil assembly 2630B of FIG. 6, so that if one voice coil responds to correct a theta-Z (θ-Z) orientation, the other voice coil is controlled in an equal and offsetting fashion. Various embodiments of gripper motion control assembly 2650 can maintain the orientation of a substrate parallel to the Y-axis of travel to within +/−4300 microradians. Accordingly, gripper motion control assembly 2650 of Y-axis motion system 2600 can maintain substrate orientation with a high degree of precision parallel to the Y-axis direction of travel in a horizontal plane determined, for example, by the fly height of a substrate.

Figure 8:
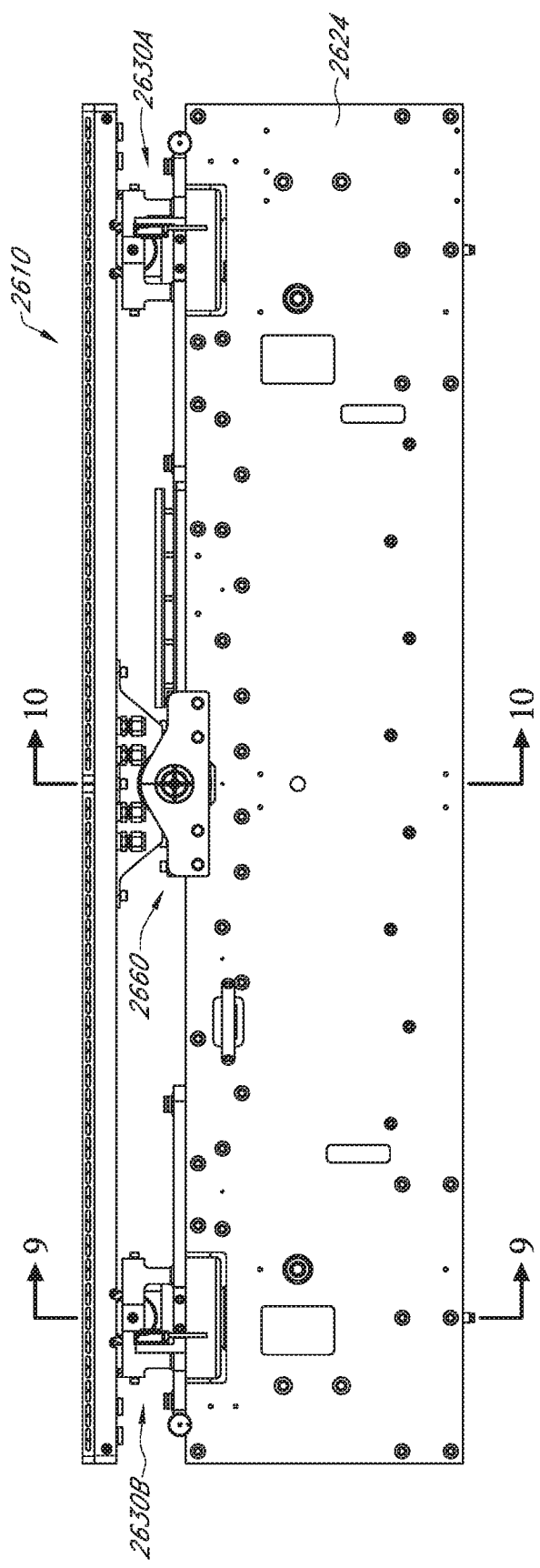
FIG. 8 is a top view of a Y-axis motion system according to various embodiments of systems and methods of the present teachings, indicating two section views.
Figure 9:
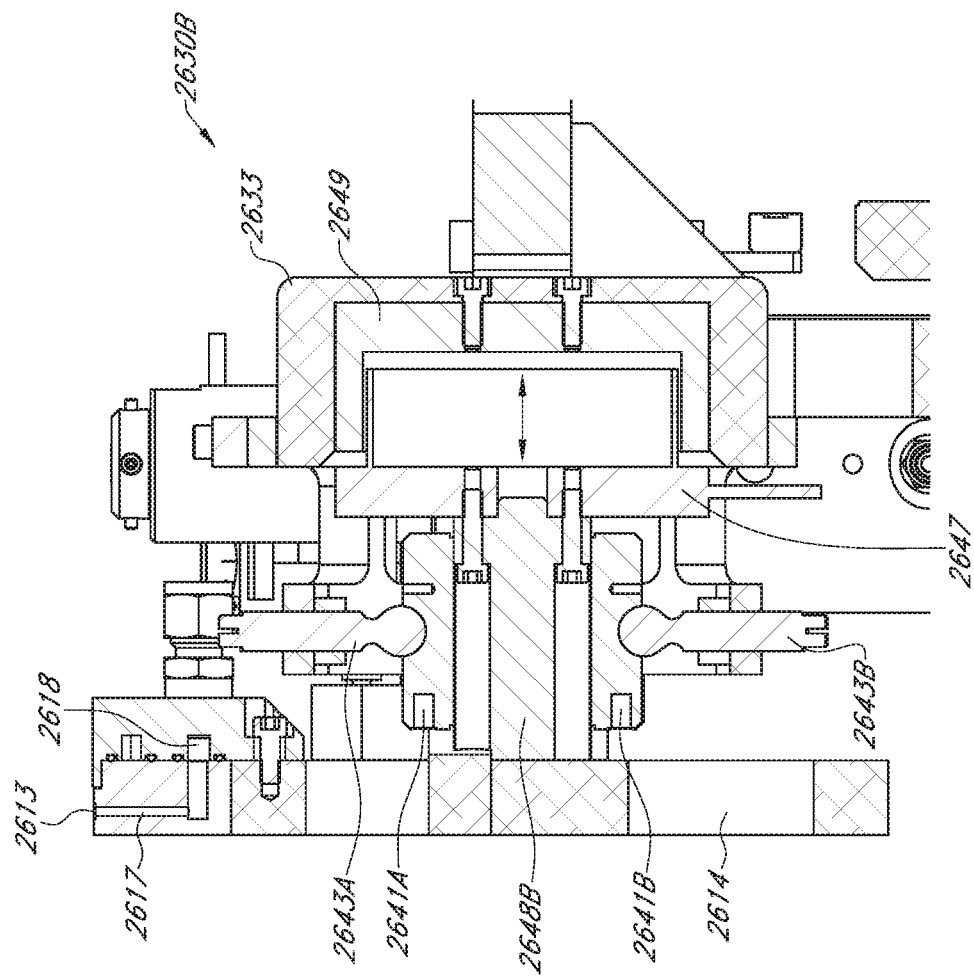
FIG. 9 is a section view of a voice coil assembly, as indicated in FIG. 8.

FIG. 8 is a top view of Y-axis motion system 2600, showing gripper assembly 2610, Y-axis carriage assembly top plate 2624, and gripper motion control assembly 2650, similar to FIG. 4A, which indicates the position of cross-section views for FIG. 8 and FIG. 9.

FIG. 9 illustrates generally a cross section view through a voice coil assembly; specifically designated in FIG. 8, as a cross-section view through voice coil assembly 2630B, though any description given herein regarding the section view of FIG. 9 applies equally to voice coil assembly 2630A. Voice coil gripper frame mounting block 2648B is depicted in FIG. 9 positioned between first air bearing 2641A and second air bearing 2641B of voice coil assembly 2630B. Associated with each of first air bearing 2641A and second air bearing 2641B is an air bearing spherical pivot; 2643A and 2643B, respectively. Air bearing spherical pivot; 2643A associated with first air bearing 2641A and air bearing spherical pivot 2643B associated with first air bearing 2641B allow each air bearing to float in theta-X (θ-X) and theta-Y (θ-Y), so that first air bearing 2641A and second air bearing 2641B remain in a parallel disposition with respect to mounting block 2648B. In addition to being positioned between first air bearing 2641A and second air bearing 2641B, voice coil gripper frame mounting block 2648B is also affixed to voice coil holder 2647. Voice coil holder 2647 and voice coil magnet base are housed inside voice coil housing second side 2633. Voice coil holder 2647 is depicted in FIG. 9 as associated with coil magnet base 2649. During operation, the force of movement of voice coil magnet base 2649 is translated to voice coil magnet holder 2647, which is translated to voice coil gripper frame mounting block 2648B, and then to gripper frame 2614 thereby. As previously discussed herein, various embodiments of a gripper motion control assembly 2650 can use a master-slave control of the two voice coil assemblies, so that the two voice coils act synchronously to maintain a gripper assembly orientation relative to the direction of travel. Also depicted in FIG. 9 are vacuum manifold 2618 of gripper assembly 2610, which is in flow communication with vacuum groove 2617. As depicted in FIG. 9, the plurality of vacuum sockets depicted in FIG. 4B can be in flow communication with vacuum manifold 2618 via vacuum groove 2617.

Figure 10:
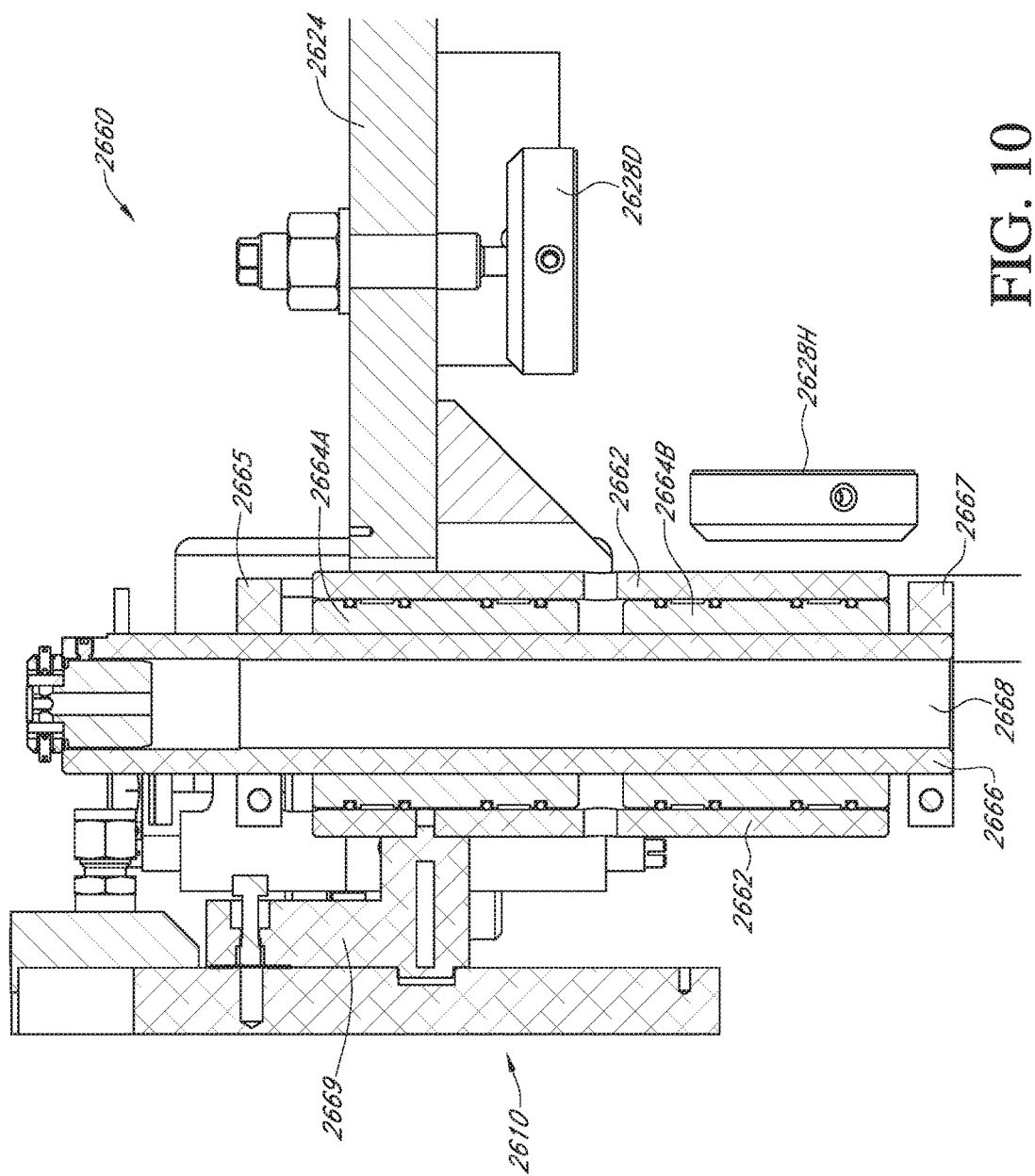
FIG. 10 is a section view of a center pivot assembly, as indicated in FIG. 8.

FIG. 10 illustrates generally a cross section view through center pivot assembly 2660 as designated in FIG. 8. Pivot assembly 2660 can include air bushing housing 2662, which can house first air bushing 2664A and second air busing 2664B. First air bushing 2664A and second air busing 2664B can be configured around center shaft 2666; the use of two air bushings imparting a requisite system stiffness. First air bushing 2664A and second air busing 2664B can be fabricated from a porous material, such as porous graphite, to ensure an even flow of a gas, such as an inert gas, can be evenly distributed around center shaft 2666. Center shaft 2666 can be held by upper clamp 2665 and lower clamp 2667, which can be secured to carriage assembly top plate 2624. Center pivot adaptor plate 2669 can be configured to affixed air bushing housing 2662 to gripper frame 2614. In that regard, any theta-Z (θ-Z) rotation of air bushing assembly 2660 as a result of carriage assembly movement will be translated to gripper assembly 2610 in response. Also depicted in FIG. 10 are carriage assembly air bearing 2638D (see FIG. 4B) and carriage assembly air bearing 2638H (see FIG. 5B).

As previously discussed herein, maintaining a controlled environment within the printing enclosure is paramount for various processes related to the manufacture of various OLED devices. According to various embodiments of a gas enclosure system of the present teachings, environmental control of an interior volume defined by a gas enclosure assembly can include control of lighting, for example, by the number and placement of lights of a specific wavelength, control of particulate matter using various embodiments of a particle control system, control of reactive gas species using various embodiments of a gas purification system, and temperature control of a gas enclosure assembly using various embodiments of a thermal regulation system, as will be discussed in more detail subsequently herein. One aspect of thermal regulation relates to minimizing heat loads within an enclosed printing system, for example, as given by the design of the Y-axis motion system as previously described herein.

Figure 11:
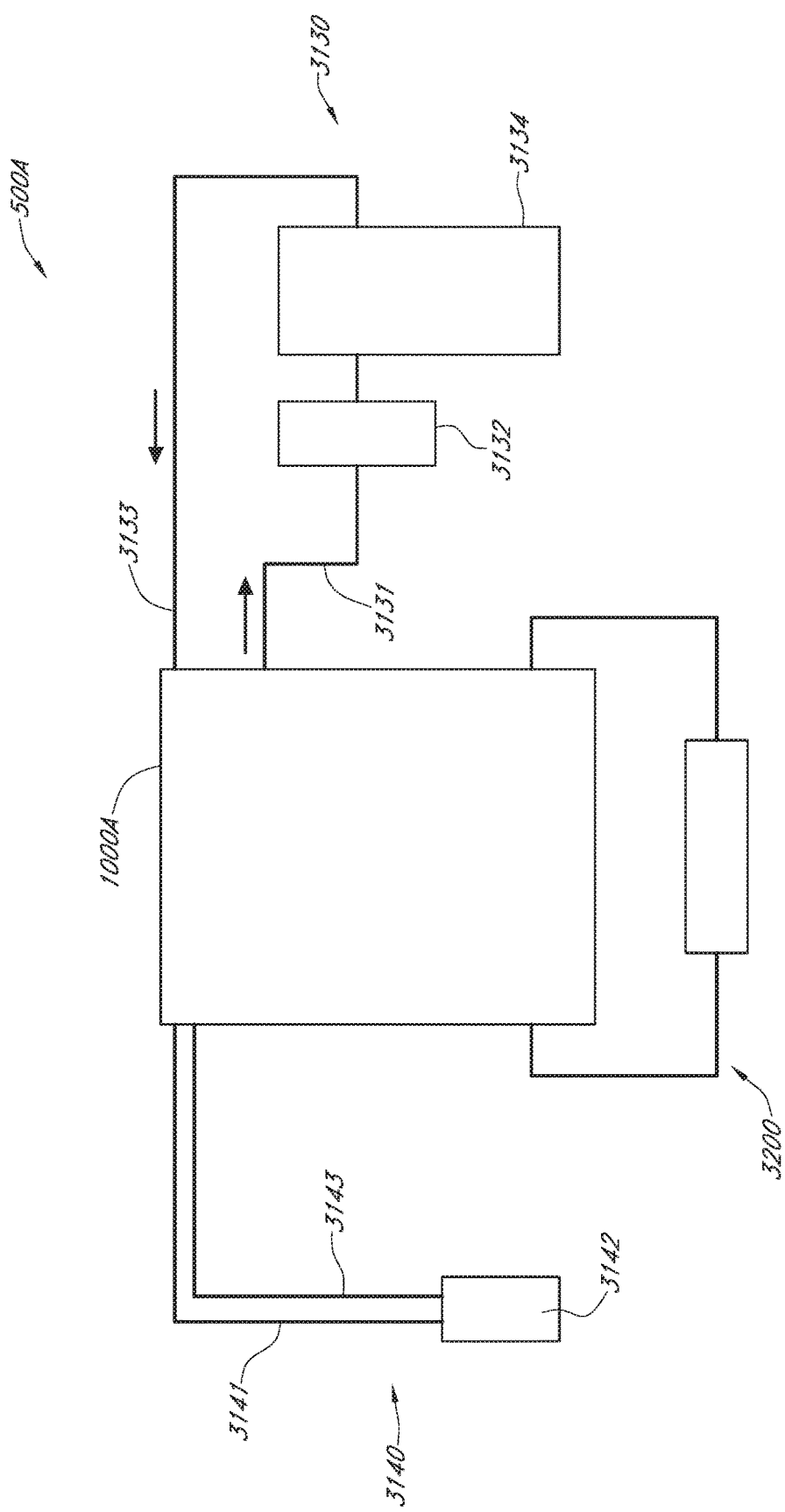
FIG. 11 is a schematic view of various embodiments of gas enclosure assembly and related system components the present teachings.

FIG. 11 is a schematic diagram showing a gas enclosure system 500A. Various embodiments of a gas enclosure system 500A according to the present teachings can comprise gas enclosure 1000A for housing a printing system, gas purification loop 3130 in fluid communication gas enclosure 1000A, and at least one thermal regulation system 3140. Additionally, various embodiments of gas enclosure system 500A can have external gas loop 3200, which can integrate and control a non-reactive (inert) gas source, such as nitrogen, any of the noble gases, and combinations thereof, as well as a clean dry air (CDA) source. External gas loop 3200 can supply inert gas for operating various devices, such as, but not limited by, substrate floatation tables, air bearings, and pneumatically operated robots, and the like, as well as substrate floatation tables for an OLED printing system. Various embodiments of external gas loop 3200 can Additionally, gas enclosure system 500A can have a circulation and filtration system internal to gas enclosure system 500A (not shown).

As depicted in FIG. 11, for various embodiments of a gas enclosure assembly according to the present teachings, the design of a filtration system can separate the inert gas circulated through gas purification loop 3130 from the inert gas that is continuously filtered and circulated internally for various embodiments of a gas enclosure assembly. Gas purification loop 3130 includes outlet line 3131 from gas enclosure 1000A, to a solvent removal component 3132 and then to gas purification system 3134. Inert gas purified of solvent and other reactive gas species, such as oxygen, ozone, and water vapor, are then returned to gas enclosure 1000A through inlet line 3133. Gas purification loop 3130 may also include appropriate conduits and connections, and sensors, for example, oxygen, ozone, water vapor and solvent vapor sensors. A gas circulating unit, such as a fan, blower or motor and the like, can be separately provided or integrated, for example, in gas purification system 3134, to circulate gas through gas purification loop 3130. According to various embodiments of a gas enclosure assembly, though solvent removal system 3132 and gas purification system 3134 are shown as separate units in the schematic shown in FIG. 11, solvent removal system 3132 and gas purification system 3134 can be housed together as a single purification unit.

Gas purification loop 3130 of FIG. 11 can have solvent removal system 3132 placed upstream of gas purification system 3134, so that inert gas circulated from gas enclosure 1000A passes through solvent removal system 3132 via outlet line 3131. According to various embodiments, solvent removal system 3132 may be a solvent trapping system based on adsorbing solvent vapor from an inert gas passing through solvent removal system 3132 of FIG. 11. A bed or beds of a sorbent, for example, but not limited by, such as activated charcoal, molecular sieves, and the like, may effectively remove a wide variety of organic solvent vapors. For various embodiments of a gas enclosure system cold trap technology may be employed to remove solvent vapors in solvent removal system 3132. As previously discussed herein, for various embodiments of a gas enclosure system according to the present teachings, sensors, such as oxygen, ozone, water vapor and solvent vapor sensors, may be used to monitor the effective removal of such species from inert gas continuously circulating through a gas enclosure system, such as gas enclosure system 500A of FIG. 11. Various embodiments of a solvent removal system can indicate when sorbent, such as activated carbon, molecular sieves, and the like, has reached capacity, so that the bed or beds of sorbent can be regenerated or replaced. Regeneration of a molecular sieve can involve heating the molecular sieve, contacting the molecular sieve with a forming gas, a combination thereof, and the like. Molecular sieves configured to trap various species, including oxygen, ozone, water vapor, and solvents, can be regenerated by heating and exposure to a forming gas that comprises hydrogen, for example, a forming gas comprising about 96% nitrogen and 4% hydrogen, with said percentages being by volume or by weight. Physical regeneration of activated charcoal can be done using a similar procedure of heating under an inert environment.

Any suitable gas purification system can be used for gas purification system 3134 of gas purification loop 3130 of FIG. 11. Gas purification systems available, for example, from MBRAUN Inc., of Statham, N.H., or Innovative Technology of Amesbury, Mass., may be useful for integration into various embodiments of a gas enclosure assembly according to the present teachings. Gas purification system 3134 can be used to purify one or more inert gases in gas enclosure system 500A, for example, to purify the entire gas atmosphere within a gas enclosure assembly. As previously discussed herein, in order to circulate gas through gas purification loop 3130, gas purification system 3134 can have a gas circulating unit, such as a fan, blower or motor, and the like. In that regard, a gas purification system can be selected depending on the volume of the enclosure, which can define a volumetric flow rate for moving an inert gas through a gas purification system. For various embodiments of gas enclosure system having a gas enclosure assembly with a volume of up to about 4 m$^3$; a gas purification system that can move about 84 m$^3$/h can be used. For various embodiments of gas enclosure system having a gas enclosure assembly with a volume of up to about 10 m$^3$; a gas purification system that can move about 155 m$^3$/h can be used. For various embodiments of a gas enclosure assembly having a volume of between about 52-114 m$^3$, more than one gas purification system may be used.

Any suitable gas filters or purifying devices can be included in the gas purification system 3134 of the present teachings. In some embodiments, a gas purification system can comprise two parallel purifying devices, such that one of the devices can be taken off line for maintenance and the other device can be used to continue system operation without interruption. In some embodiments, for example, the gas purification system can comprise one or more molecular sieves. In some embodiments, the gas purification system can comprise at least a first molecular sieve, and a second molecular sieve, such that, when one of the molecular sieves becomes saturated with impurities, or otherwise is deemed not to be operating efficiently enough, the system can switch to the other molecular sieve while regenerating the saturated or non-efficient molecular sieve. A control unit can be provided for determining the operational efficiency of each molecular sieve, for switching between operation of different molecular sieves, for regenerating one or more molecular sieves, or for a combination thereof. As previously discussed herein, molecular sieves may be regenerated and reused.

Thermal regulation system 3140 of FIG. 11 can include at least one chiller 3142, which can have fluid outlet line 3141 for circulating a coolant into a gas enclosure assembly, and fluid inlet line 3143 for returning the coolant to the chiller. An at least one fluid chiller 3142 can be provided for cooling the gas atmosphere within gas enclosure system 500A. For various embodiments of a gas enclosure system of the present teachings, fluid chiller 3142 delivers cooled fluid to heat exchangers within the enclosure, where inert gas is passed over a filtration system internal the enclosure. At least one fluid chiller can also be provided with gas enclosure system 500A to cool heat evolving from an apparatus enclosed within gas enclosure system 500A. For example, but not limited by, at least one fluid chiller can also be provided for gas enclosure system 500A to cool heat evolving from an OLED printing system. Thermal regulation system 3140 can comprise heat-exchange or Peltier devices and can have various cooling capacities. For example, for various embodiments of a gas enclosure system, a chiller can provide a cooling capacity of from between about 2 kW to about 20 kW. Various embodiments of a gas enclosure system can have a plurality of fluid chillers that can chill one or more fluids. In some embodiments, the fluid chillers can utilize a number of fluids as coolant, for example, but not limited by, water, anti-freeze, a refrigerant, and a combination thereof as a heat exchange fluid. Appropriate leak-free, locking connections can be used in connecting the associated conduits and system components.

As previously discussed herein, the present teachings disclose various embodiments of a gas enclosure system that can include a printing system enclosure defining a first volume and an auxiliary enclosure defining a second volume. Various embodiments of a gas enclosure system can have an auxiliary enclosure that can be sealably constructed as a section of gas enclosure assembly. According to systems and methods of the present teachings, an auxiliary enclosure can be sealable isolated from a printing system enclosure, and can be opened to an environment external a gas enclosure assembly without exposing a printing system enclosure to the external environment. Such physical isolation of an auxiliary enclosure to perform, for example, but not limited by, various printhead management procedures, can be done to eliminate or minimize the exposure of a printing system enclosure to contamination, such as air and water vapor and various organic vapors, as well as particulate contamination. Various printhead management procedures that can include measurement and maintenance procedures on a printhead assembly can be done with little or no interruption of a printing process, thereby minimizing or eliminating gas enclosure system downtime.

For a gas enclosure system having a printing system enclosure defining a first volume and an auxiliary enclosure defining a second volume, both volumes can be readily integrated with gas circulation, filtration and purification components to form a gas enclosure system that can sustain an inert, substantially low-particle environment for processes requiring such an environment with little or no interruption of a printing process. According to various systems and methods of the present teachings, a printing system enclosure may be introduced to a level of contamination that is sufficiently low that a purification system can remove the contamination before it can affect a printing process. Various embodiments of an auxiliary enclosure can be a substantially smaller volume of the total volume of a gas enclosure assembly and can be readily integrated with gas circulation, filtration and purification components to form an auxiliary enclosure system that can rapidly recover an inert, of a low-particle environment after exposure to an external environment, thereby providing little or no interruption of a printing process.

Additionally, various embodiments of an auxiliary enclosure can be readily integrated with a dedicated set of environmental regulation system components, such as lighting, gas circulation and filtration, gas purification, and thermostating components. In that regard, various embodiments of a gas enclosure system that include an auxiliary enclosure that can be sealably isolated as a section of gas enclosure assembly can have a controlled environment that is set to be uniform with a first volume defined by a gas enclosure assembly housing a printing system. Further, various embodiments of a gas enclosure system including an auxiliary enclosure that can be sealably isolated as a section of gas enclosure assembly can have a controlled environment that is set to be different than the controlled environment of a first volume defined by a gas enclosure assembly housing a printing system.

While the examples above mentioning cooling capacities and chilling applications, the examples above can also be applied to applications where including buffering of substrates in a controlled environment, or for applications where circulating gas can be maintained at a temperature similar to other portions of the system, such as to avoid unwanted heat transfer from substrates being fabricated or to avoid disruption of temperature uniformity across a substrate or between substrates.

Figure 12:
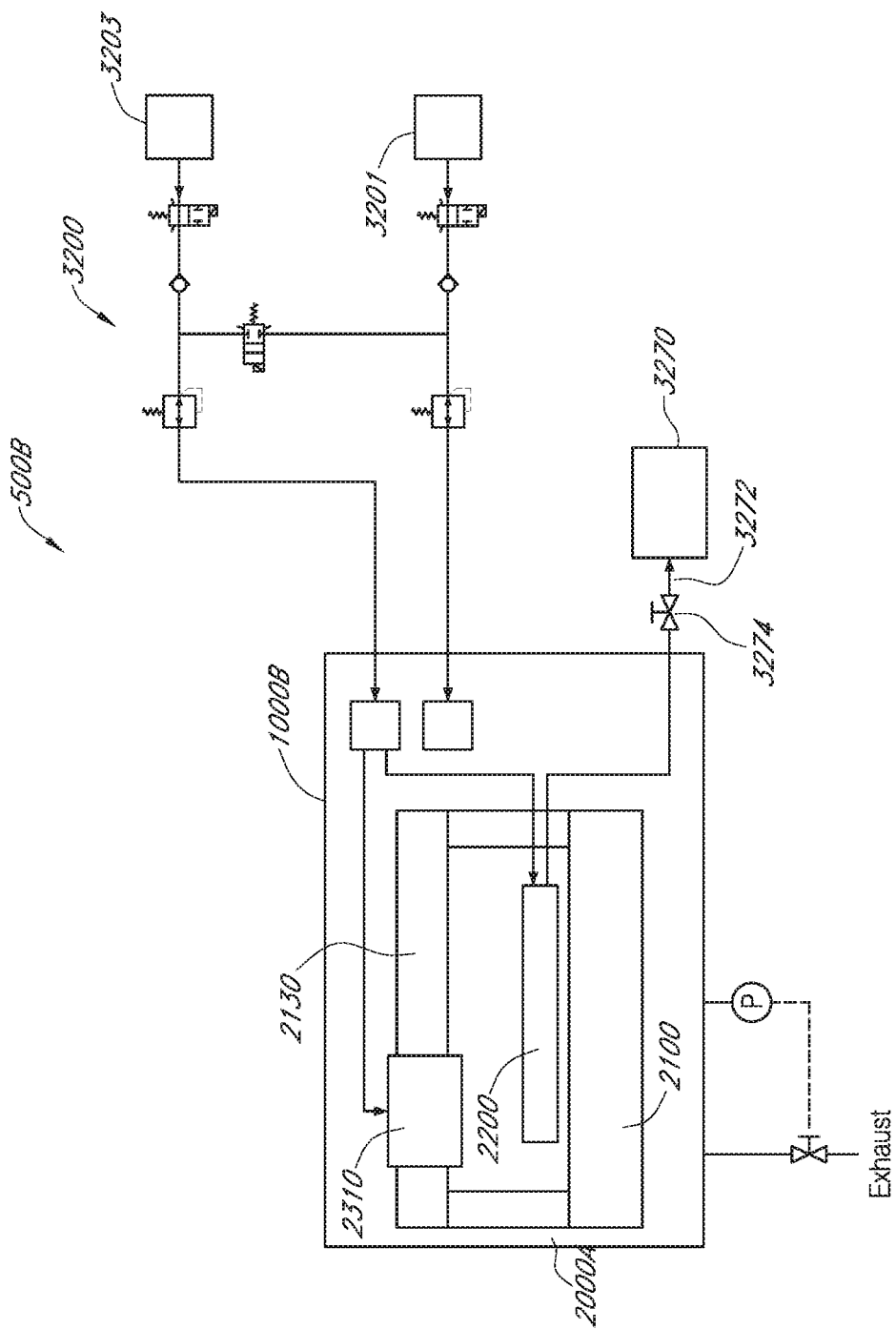
FIG. 12 is a schematic view of various embodiments of an enclosed printing system and components for: 1) integrating and controlling gas sources such as can be used to establish a controlled gas environment in a gas enclosure, as well as gas for use various pneumatically operated devices and apparatuses; 2) integrating and controlling vacuum sources, such as can be used for a vacuum pre-load for an ultrasonic air bearing.

FIG. 12 illustrates generally an example of gas enclosure system 500B for integrating and controlling non-reactive gas and clean dry air (CDA) sources such as can be used to establish the controlled environment referred to in other examples described elsewhere herein. Printing system 2000A of gas enclosure system 500B can include Ultrasonic floatation table 2200, mounted on printing system base 2100. For various embodiments of printing system 2000A of gas enclosure system 500B, X-axis carriage assembly 2300, mounted on printing system bridge 2130, can utilize a linear air bearing motion system, which are intrinsically low-particle generating. Accordingly, various embodiments of gas enclosure system 500B that utilize low-particle generating apparatuses and devices, such as, but not limited by, a linear air bearing motion system for positioning X-axis carriage assembly 2300, as well as ultrasonic floatation table 2200, in conjunction with a low-particle filtration and circulation system can maintain a low-particle environment required for flat panel display manufacture.

Various embodiments of gas enclosure system 500B of FIG. 12 described herein include enclosed modules that can be environmentally-controlled. Enclosure assemblies and corresponding support equipment can be referred to as a "gas enclosure system" and such enclosure assemblies can be constructed in a contoured fashion that reduces or minimizes an internal volume of a gas enclosure assembly, and at the same time provides a working volume for accommodating various footprints of printing system components, such as the deposition (e.g., printing), holding, loading, or treatment modules described herein. For example, a contoured gas enclosure assembly according to the present teachings can have a gas enclosure volume of between about 6 m$^3$ to about 95 m$^3$ for various examples of a gas enclosure assembly of the present teachings covering, for example, substrate sizes from Gen 3.5 to Gen 10. Various examples of a contoured gas enclosure assembly according to the present teachings can have a gas enclosure volume of, for example, but not limited by, of between about 15 m$^3$ to about 30 m$^3$, which might be useful for printing of, for example, but not limited by, Gen 5.5 to Gen 8.5 substrate sizes or other substrate sizes. Various examples of an auxiliary enclosure can be constructed as a section of gas enclosure assembly and readily integrated with gas circulation and filtration, as well as purification components to form a gas enclosure system that can sustain a controlled, substantially low-particle environment for processes requiring such an environment.

For example, as shown in FIG. 12, various examples of gas enclosure system 500B can have external gas loop 3200 for integrating and controlling a non-reactive gas source 3201 and clean dry air (CDA) source 3203 for use in various aspects of operation of gas enclosure system 500B. Gas enclosure system 500B can also include various examples of an internal particle filtration and gas circulation system, as well as various examples of an external gas purification system, as previously described. Such examples of a gas enclosure system can include a gas purification system for purifying various reactive species from a gas. Some commonly used non-limiting examples of a non-reactive gas can include nitrogen, any of the noble gases, and any combination thereof. Various examples of a gas purification system according to the present teachings can maintain levels for each species of various reactive species, including various reactive atmospheric gases, such as water vapor, oxygen, ozone, as well as organic solvent vapors at 1000 ppm or lower, for example, at 100 ppm or lower, at 10 ppm or lower, at 1.0 ppm or lower, or at 0.1 ppm or lower. In addition to external loop 3200 for integrating and controlling gas source 3201 and CDA source 3203, gas enclosure system 500B can have vacuum system 3270. Vacuum system 3270 can be in flow communication with gas enclosure 1000B through line 3272 when valve 3274 is in an open position. Vacuum system 3270 can be configured to provide a specified low-pressure preload to ultrasonic floatation table 2200, according to the present teachings as previously discussed herein with respect to FIG. 2A through FIG. 2C.

FIG. 12 illustrates generally a configuration wherein a pressure of gas inside the gas enclosure 1000B can be maintained within a desired or specified range, such as using a valve coupled to a pressure monitor, P, where the valve allows gas to be exhausted to another enclosure, system, or a region surrounding the gas enclosure 1000B using information obtained from the pressure monitor. Such gas can be recovered and re-processed as in other examples described herein. As mentioned above, such regulation can assist in maintaining a slight positive internal pressure of a gas enclosure system, because pressurized gas is also contemporaneously introduced into the gas enclosure system. Variable demand of various devices and apparatuses can create an irregular pressure profile for various gas enclosure assemblies and systems of the present teachings. Accordingly, the approach shown in FIG. 12 can be used in to assist in maintaining a dynamic pressure balance for a gas enclosure system held at a slight positive pressure relative to the environment surrounding the enclosure.

Enclosed Printing System: Considerations Regarding a Controlled Environment

Various embodiments of a gas enclosure assembly can be sealably constructed and integrated with various components that provide a gas circulation and filtration system, a particle control system, a gas purification system, and a thermal regulation system and the like to form various embodiments of a gas enclosure system that can sustain an inert gas environment that is substantially low-particle for processes requiring such an environment. Various embodiments of a gas enclosure can have a printing system enclosure and an auxiliary enclosure constructed as a section of a gas enclosure assembly, which can be sealably isolated from the printing system enclosure of a gas enclosure. Various embodiments of a printing system of the present teachings can have a printhead management system enclosed in an auxiliary enclosure. Embodiments of printhead management system of the present teachings can include various devices and apparatuses for maintenance and calibration of a printhead; the various devices and apparatuses each mounted on a motion system platform for the fine positioning of the various devices and apparatuses relative to a printhead.

A printing system, such as printing system 2000 of FIG. 1B, shown in expanded view in FIG. 1C, can be comprised of several devices and apparatuses, which allow the reliable placement of ink drops onto specific locations on a substrate. Printing requires relative motion between the printhead assembly and the substrate. This can be accomplished with a motion system, typically a gantry or split axis XYZ system. Either the printhead assembly can move over a stationary substrate (gantry style), or both the printhead and substrate can move, in the case of a split axis configuration. In another embodiment, a printhead assembly can be substantially stationary; for example, in the X and Y axes, and the substrate can move in the X and Y axes relative to the printheads, with Z axis motion provided either by a substrate support apparatus or by a Z-axis motion system associated with a printhead assembly. As the printheads move relative to the substrate, droplets of ink are ejected at the correct time to be deposited in the desired location on a substrate. A substrate can be inserted and removed from the printer using a substrate loading and unloading system. Depending on the printer configuration, this can be accomplished with a mechanical conveyor, a substrate floatation table with a conveyance assembly, or a substrate transfer robot with end effector. For various embodiments of systems and methods of the present teachings, an Y-axis motion system can be based on an air-bearing gripper system.

For clearer perspective regarding substrate sizes that can be used in manufacturing of various OLED devises, generations of mother glass substrate sizes have been undergoing evolution for flat panel displays fabricated by other-than OLED printing since about the early 1990s. The first generation of mother glass substrates, designated as Gen 1, is approximately 30 cm×40 cm, and therefore could produce a 15" panel. Around the mid-1990s, the existing technology for producing flat panel displays had evolved to a mother glass substrate size of Gen 3.5, which has dimensions of about 60 cm×72 cm. In comparison, a Gen 5.5 substrate has dimensions of about 130 cm×150 cm.

As generations have advanced, mother glass sizes for Gen 7.5 and Gen 8.5 are in production for other-than OLED printing fabrication processes. A Gen 7.5 mother glass has dimensions of about 195 cm×225 cm, and can be cut into eight 42" or six 47" flat panels per substrate. The mother glass used in Gen 8.5 is approximately 220×250 cm, and can be cut to six 55" or eight 46" flat panels per substrate. The promise of OLED flat panel display for qualities such as truer color, higher contrast, thinness, flexibility, transparency, and energy efficiency have been realized, at the same time that OLED manufacturing is practically limited to G 3.5 and smaller. Currently, OLED printing is believed to be the optimal manufacturing technology to break this limitation and enable OLED panel manufacturing for not only mother glass sizes of Gen 3.5 and smaller, but at the largest mother glass sizes, such as Gen 5.5, Gen 7.5, and Gen 8.5. One of the features of OLED panel display technology includes that a variety of substrate materials can be used, for example, but not limited by, a variety of glass substrate materials, as well as a variety of polymeric substrate materials. In that regard, sizes recited from the terminology arising from the use of glass-based substrates can be applied to substrates of any material suitable for use in OLED printing.

Manufacturing tools that in principle can allow for the printing of a variety of substrate sizes that includes large-format substrate sizes, can require substantially large facilities for housing such OLED manufacturing tools. Accordingly, maintaining an entire large facility under an inert atmosphere presents engineering challenges, such as continual purification of a large volume of an inert gas. Various embodiments of a gas enclosure system can have a circulation and filtration system internal a gas enclosure assembly in conjunction with a gas purification system external a gas enclosure that together can provide continuous circulation of a substantially low-particulate inert gas having substantially low levels of reactive species throughout a gas enclosure system. According to the present teachings, an inert gas may be any gas that does not undergo a chemical reaction under a defined set of conditions. Some commonly used non-limiting examples of an inert gas can include nitrogen, any of the noble gases, and any combination thereof. Additionally, providing a large facility that is essentially hermetically sealed to prevent contamination of various reactive atmospheric gases, such as water vapor, oxygen, and ozone, as well as organic solvent vapors generated from various printing process poses an engineering challenge. According to the present teachings, an OLED printing facility would maintain levels for each species of various reactive species, including various reactive atmospheric gases, such as water vapor, oxygen and ozone, as well as organic solvent vapors at 100 ppm or lower, for example, at 10 ppm or lower, at 1.0 ppm or lower, or at 0.1 ppm or lower.

The need for printing an OLED panel in a facility in which the levels of each of a reactive species should be maintained at targeted low levels can be illustrated in reviewing the information summarized in Table 1. The data summarized on Table 1 resulted from the testing of each of a test coupon comprising organic thin film compositions for each of red, green, and blue, fabricated in a large-pixel, spin-coated device format. Such test coupons are substantially easier to fabricate and test for the purpose of rapid evaluation of various formulations and processes. Though test coupon testing should not be confused with lifetime testing of a printed panel, it can be indicative of the impact of various formulations and processes on lifetime. The results shown in the table below represent variation in the process step in the fabrication of test coupons in which only the spin-coating environment varied for test coupons fabricated in a nitrogen environment where reactive species were less than 1 ppm compared to test coupons similarly fabricated but in air instead of a nitrogen environment.

It is evident through the inspection of the data in Table 1 for test coupons fabricated under different processing environments, particularly in the case of red and blue, that printing in an environment that effectively reduces exposure of organic thin film compositions to reactive species may have a substantial impact on the stability of various ELs, and hence on lifetime. The lifetime specification is of particular significance for OLED panel technology, as this correlates directly to display product longevity; a product specification for all panel technologies, which has been challenging for OLED panel technology to meet. In order to provide panels meeting requisite lifetime specifications, levels of each of a reactive species, such as water vapor, oxygen and ozone, as well as organic solvent vapors, can be maintained at 100 ppm or lower, for example, at 10 ppm or lower, at 1.0 ppm or lower, or at 0.1 ppm or lower with various embodiments of a gas enclosure system of the present teachings.

TABLE 1

Impact of inert gas processing on lifetime for OLED panels

| Color | Process Environment | V @ 10 mA/cm² | Cd/A | CIE (x, y) | T95 | T80 | T50 |
|---|---|---|---|---|---|---|---|
| | | | | @ 1000 Cd/m² | | | |
| Red | Nitrogen | 6 | 9 | (0.61, 0.38) | 200 | 1750 | 10400 |
| | Air | 6 | 8 | (0.60, 0.39) | 30 | 700 | 5600 |
| Green | Nitrogen | 7 | 66 | (0.32, 0.63) | 250 | 3700 | 32000 |
| | Air | 7 | 61 | (0.32, 0.62) | 250 | 2450 | 19700 |
| Blue | Nitrogen | 4 | 5 | (0.14, 0.10) | 150 | 750 | 3200 |
| | Air | 4 | 5 | (0.14, 0.10) | 15 | 250 | 1800 |

In addition to providing an inert environment, maintaining a substantially low-particle environment for OLED printing is of particular importance, as even very small particles can lead to a visible defect on an OLED panel. Particle control in a gas enclosure system can present significant challenges not presented for processes that can be done, for example, in atmospheric conditions under open air, high flow laminar flow filtration hoods. For example, of a manufacturing facility can require a substantial length of various service bundles that can be operatively connected from various systems and assemblies to provide optical, electrical, mechanical, and fluidic connections required to operate, for example, but not limited by, a printing system. Such service bundles used in the operation of a printing system and located proximal to a substrate positioned for printing can be an ongoing source of particulate matter. Additionally, components used in a printing system, such as fans or linear motion systems that use friction bearing, can be particle generating components. Various embodiments of a gas circulation and filtration system of the present teachings can be used in conjunction with particle control components to contain and exhaust particulate matter. Additionally, by using a variety of intrinsically low-particle generating pneumatically operated components, such as, but not limited by, substrate floatation tables, air bearings, and pneumatically operated robots, and the like, a low particle environment for various embodiments of a gas enclosure system can be maintained.

Regarding maintaining a substantially low-particle environment, various embodiments of a gas circulation and filtration system can be designed to provide a low particle inert gas environment for airborne particulates meeting the standards of International Standards Organization Standard (ISO) 14644-1:1999, "Cleanrooms and associated controlled environments—Part 1: Classification of air cleanliness," as specified by Class 1 through Class 5. However, controlling airborne particulate matter alone is not sufficient for providing a low-particle environment proximal to a substrate during, for example, but not limited by, a printing process, as particles generated proximal to a substrate during such a process can accumulate on a substrate surface before they can be swept through a gas circulation and filtration system.

Accordingly, in conjunction with a gas circulation and filtration system, various embodiments of a gas enclosure system of the present teachings can have a particle control system that can include components that can provide a low-particle zone proximal to a substrate during processing in a printing step. A particle control system for various embodiments of a gas enclosure system of the present teachings can include a gas circulation and filtration system, a low-particle-generating X-axis linear air bearing system for moving a printhead assembly relative to a substrate, a low-particle-generating Y-axis linear air bearing system for conveying a substrate, and an ultrasonic floatation table for supporting a substrate. For example, a gas enclosure system can have a gas circulation and filtration system internal a gas enclosure assembly.

Various embodiments of systems and methods of the present teachings can maintain a substantially low-particle environment providing for an average on-substrate distribution of particles of a particular size range of interest that does not exceed an on-substrate deposition rate specification. An on-substrate deposition rate specification can be set for each of a particle size range of interest of between about 0.1 μm and greater to about 10 μm and greater. In various embodiments systems and methods of the present teachings, an on-substrate particle deposition rate specification can be expressed as a limit of the number of particles deposited per square meter of substrate per minute for each of a target particle size range.

Various embodiments of an on-substrate particle deposition rate specification can be readily converted from a limit of the number of particles deposited per square meter of substrate per minute to a limit of the number of particles deposited per substrate per minute for each of a target particle size range. Such a conversion can be readily done through a known relationship between substrates, for example, of a specific generation-sized substrate and the corresponding area for that substrate generation. For example, Table 2 below summarizes aspect ratios and areas for some known generation-sized substrates. It should be understood that a slight variation of aspect ratio and hence size may be seen from manufacturer to manufacturer. However, regardless of such variation, a conversion factor for a specific generation-sized substrate and an area in square meters can be obtained any of a variety of generation-sized substrates.

TABLE 2

Correlation between area and substrate size

| Generation ID | X (mm) | Y (mm) | Area (m2) |
|---|---|---|---|
| Gen 3.0 | 550 | 650 | 0.36 |
| Gen 3.5 | 610 | 720 | 0.44 |
| Gen 3.5 | 620 | 750 | 0.47 |
| Gen 4 | 680 | 880 | 0.60 |
| Gen 4 | 730 | 920 | 0.67 |
| Gen 5 | 1100 | 1250 | 1.38 |
| Gen 5 | 1100 | 1300 | 1.43 |
| Gen 5.5 | 1300 | 1500 | 1.95 |
| Gen 6 | 1500 | 1850 | 2.78 |
| Gen 7.5 | 1950 | 2250 | 4.39 |
| Gen 8 | 2160 | 2400 | 5.18 |
| Gen 8 | 2160 | 2460 | 5.31 |
| Gen 8.5 | 2200 | 2500 | 5.50 |
| Gen 9 | 2400 | 2800 | 6.72 |
| Gen 10 | 2850 | 3050 | 8.69 |

Additionally, an on-substrate particle deposition rate specification expressed as a limit of the number of particles deposited per square meter of substrate per minute can be readily converted to any of a variety of unit time expressions. It will be readily understood that an on-substrate particle deposition rate specification normalized to minutes can be readily converted to any other expression of time through know relationships of time, for example, but not limited by, such as second, hour, day, etc. Additionally, units of time specifically relating to processing can be used. For example, a print cycle can be associated with a unit of time. For various embodiments of a gas enclosure system according to the present teachings a print cycle can be a period of time in which a substrate is moved into a gas enclosure system for printing and then removed from a gas enclosure system after printing is complete. For various embodiments of a gas enclosure system according to the present teachings a print cycle can be a period of time from the initiation of the alignment of a substrate with respect to a printhead assembly to the delivery of a last ejected drop of ink onto the substrate. In the art of processing, total average cycle time or TACT can be an expression of a unit of time for a particular process cycle. According to various embodiments of systems and methods of the present teachings, TACT for a print cycle can be about 30 seconds. For various embodiments of systems and methods of the present teachings, TACT for a print cycle can be about 60 seconds. In various embodiments of systems and methods of the present teachings, TACT for a print cycle can be about 90 seconds. For various embodiments of systems and methods of the present teachings, TACT for a print cycle can be about 120 seconds. In various embodiments of systems and methods of the present teachings, TACT for a print cycle can be about 300 seconds.

With respect to airborne particulate matter and particle deposition within a system, a substantial number of variables can impact developing a general model that may adequately compute, for example, an approximation of a value for particle fallout rate on a surface, such as a substrate, for any particular manufacturing system. Variables such as the size of particles, the distribution of particles of particular size; surface area of a substrate and the time of exposure of a substrate within a system can vary depending on various manufacturing systems. For example, the size of particles and the distribution of particles of particular size can be substantially impacted by the source and location of particle-generating components in various manufacturing systems. Calculations based on various embodiments of gas enclosure systems of the present teachings suggest that without various particle control systems of the present teachings, on-substrate deposition of particulate matter per print cycle per square meter of substrate can be between more than about 1 million to more than about 10 million particles for particles in a size range of 0.1 µm and greater. Such calculations suggest that that without various particle control systems of the present teachings, on-substrate deposition of particulate matter per print cycle per square meter of substrate can be between more than about 1000 to about more than about 10,000 particles for particles in a size range of about 2 µm and greater.

Various embodiments of a low-particle gas enclosure system of the present teachings can maintain a low-particle environment providing for an average on-substrate particle distribution that meets an on-substrate deposition rate specification of less than or equal to about 100 particles per square meter of substrate per minute for particles greater than or equal to 10 µm in size. Various embodiments of a low-particle gas enclosure system of the present teachings can maintain a low-particle environment providing for an average on-substrate particle distribution that meets an on-substrate deposition rate specification of less than or equal to about 100 particles per square meter of substrate per minute for particles greater than or equal to 5 µm in size. In various embodiments of a gas enclosure system of the present teachings, a low-particle environment can be maintained providing for an average on-substrate particle distribution that meets an on-substrate deposition rate specification of less than or equal to about 100 particles per square meter of substrate per minute for particles greater than or equal to 2 µm in size. In various embodiments of a gas enclosure system of the present teachings, a low-particle environment can be maintained providing for an average on-substrate particle distribution that meets an on-substrate deposition rate specification of less than or equal to about 100 particles per square meter of substrate per minute for particles greater than or equal to 1 µm in size. Various embodiments of a low-particle gas enclosure system of the present teachings can maintain a low-particle environment providing for an average on-substrate particle distribution that meets an on-substrate deposition rate specification of less than or equal to about 1000 particles per square meter of substrate per minute for particles greater than or equal to 0.5 µm in size. For various embodiments of a gas enclosure system of the present teachings, a low-particle environment can be maintained providing for an average on-substrate particle distribution that meets an on-substrate deposition rate specification of less than or equal to about 1000 particles per square meter of substrate per minute for particles greater than or equal to 0.3 µm in size. Various embodiments of a low-particle gas enclosure system of the present teachings can maintain a low-particle environment providing for an average on-substrate particle distribution that meets an on-substrate deposition rate specification of less than or equal to about 1000 particles per square meter of substrate per minute for particles greater than or equal to 0.1 µm in size.

It is contemplated that a wide variety of ink formulations can be printed within the inert, substantially low-particle environment of various embodiments of a gas enclosure system of the present teachings. During the manufacture of an OLED display, an OLED pixel can be formed to include an OLED film stack, which can emit light of a specific peak wavelength when a voltage is applied. An OLED film stack structure between an anode and a cathode can include a hole injection layer (HIL), a hole transport layer (HTL), an emissive layer (EL), an electron transport layer (ETL) and an electron injection layer (EIL). In some embodiments of an OLED film stack structure, an electron transport layer (ETL) can be combined with an electron injection layer (EIL) to form an ETL/EIL layer. According to the present teachings, various ink formulations for an EL for various color pixel EL films of an OLED film stack can be printed using, for example, inkjet printing. Additionally, for example, but not limited by, the HIL, HTL, EML, and ETL/EIL layers can have ink formulations that can be printed using inkjet printing.

It is further contemplated that an organic encapsulation layer can be printed on a substrate printing. It is contemplated that an organic encapsulation layer can be printed using inkjet printing, as inkjet printing can provide several advantages. First, a range of vacuum processing operations can be eliminated because such inkjet-based fabrication can be performed at atmospheric pressure. Additionally, during an inkjet printing process, an organic encapsulation layer can be localized to cover portions of an OLED substrate over and proximal to an active region, to effectively encapsulate an active region, including lateral edges of the active region. The targeted patterning using inkjet printing results in eliminating material waste, as well as eliminating additional processing typically required to achieve patterning of an organic layer. An encapsulation ink can comprise a polymer including, for example, but not limited by, an acrylate, methacrylate, urethane, or other material, as well as copolymers and mixtures thereof, which can be cured using thermal processing (e.g. bake), UV exposure, and combinations thereof. As used herein polymer and copolymer can include any form of a polymer component that can be formulated into an ink and cured on a substrate to form an organic encapsulation layer. Such polymeric components can include polymers, and copolymers, as well as precursors thereof, for example, but not limited by, monomers, oligomers, and resins.

Various embodiments of a gas enclosure assembly can have various frame members that are constructed to provide contour for a gas enclosure assembly. Various embodiments of a gas enclosure assembly of the present teachings can accommodate an OLED printing system, while optimizing the working space to minimize inert gas volume, and also allowing ready access to an OLED printing system from the exterior during processing. In that regard, various gas enclosure assemblies of the present teachings can have a contoured topology and volume. As will be discussed in more detail subsequently herein, various embodiments of a gas enclosure can be contoured around a printing system base, upon which a substrate support apparatus can be mounted. Further, a gas enclosure can be contoured around a bridge structure of a printing system used for the X-axis movement of a carriage assembly. As a non-limiting example, various embodiments of a contoured gas enclosure according to the present teachings can have a gas enclosure volume of between about 6 m$^3$ to about 95 m$^3$ for housing various embodiments of a printing system capable of printing substrate sizes from Gen 3.5 to Gen 10. By way a further non-limiting example, various embodiments of a contoured gas enclosure according to the present teachings can have a gas enclosure volume of between about 15 m$^3$ to about 30 m$^3$ for housing various embodiments of a printing system capable of printing, for example, Gen 5.5 to Gen 8.5 substrate sizes. Such embodiments of a contoured gas enclosure can be between about 30% to about 70% savings in volume in comparison to a non-contoured enclosure having non-contoured dimensions for width, length and height.

It should be understood that various alternatives to the embodiments of the disclosure described herein may be employed in practicing the disclosure. For example, while vastly different arts such as chemistry, biotechnology, high technology and pharmaceutical arts may benefit from the present teachings. Printing is used to exemplify the utility of various embodiments of a gas enclosure system according to the present teachings. Various embodiments of a gas enclosure system that may house a printing system can provide features such as, but not limited by, sealing providing an hermetic-sealed enclosure through cycles of construction and deconstruction, minimization of enclosure volume, and ready access from the exterior to the interior during processing, as well as during maintenance. Such features of various embodiments of a gas enclosure system may have an impact on functionality, such as, but not limited by, structural integrity providing ease of maintaining low levels of reactive species during processing, as well as rapid enclosure-volume turnover minimizing downtime during maintenance cycles. As such, various features and specifications providing utility for substrate printing may also provide benefit to a variety of technology areas.

While embodiments of the present disclosure have been shown and described herein, it will be obvious to those skilled in the art that such embodiments are provided by way of example only. Numerous variations, changes, and substitutions will now occur to those skilled in the art without departing from the disclosure. It is intended that the following claims define the scope of the disclosure and that methods and structures within the scope of these claims and their equivalents be covered thereby.

What is claimed is:

1. A printing system comprising:
   a gas enclosure defining an interior; and
   a printing system housed within the interior of the gas enclosure assembly comprising:
   a printhead assembly comprising at least one printhead;
   a substrate support apparatus for supporting a substrate, wherein the substrate support apparatus comprises an ultrasonic floatation table; and
   a motion system for positioning the substrate relative to the printhead assembly, the motion system comprising:
   a Y-axis linear air bearing motion system configured with a substrate gripper assembly for gripping the substrate, and a gripper motion control system for maintaining the substrate orientation parallel to the Y-axis of travel; and
   an X-axis linear air bearing motion system.

2. The printing system of claim 1, wherein the gripper motion system can maintain the orientation of a substrate parallel to the Y-axis of travel to within +/−4300 microradians.

3. The printing system of claim 1, wherein the ultrasonic floatation table is configured to provide a vacuum preload.

4. The printing system of claim 3, the ultrasonic floatation table is configured with a vacuum manifold to provide a vacuum preload.

5. The printing system of claim 3, the ultrasonic floatation table is configured with a porous plate to provide a vacuum preload.

6. The printing system of claim 3, wherein the vacuum preload provides for a face-up orientation of the substrate.

7. The printing system of claim 3, wherein the vacuum preload provides for a face-down orientation of the substrate.

8. The printing system of claim 1, wherein the ultrasonic floatation table is configured to support a substrate of a size ranging from about generation 3.5 to about generation 10.

9. The printing system of claim 1, wherein the printing system further comprises a gas circulation and filtration system.

10. The printing system of claim 9, wherein the filtration system is configured to provide a low-particle environment comprising an on-substrate deposition rate specification of less than or equal to about 100 particles per square meter of substrate per minute for particles greater than or equal to 2 mm in size.

11. The printing system of claim 10, wherein the printing system further comprises a gas purification system.

12. The printing system of claim 11, wherein the gas purification system maintains the gas at less than 100 ppm of each of a reactive species.

13. The printing system of claim 12, wherein the reactive species are selected from water vapor oxygen and ozone.

14. The printing system of claim 13, wherein a gas contained in the interior of the gas enclosure is an inert gas.

15. The printing system of claim 14, wherein the inert gas is selected from nitrogen, any of the noble gases and combinations thereof.

16. A method for printing a substrate in a printing system comprising:
- controlling a processing environment in a gas enclosure configured to house the printing system, wherein the processing environment is controlled within a defined specification that is different from an environment external to the gas enclosure;
- levitating a substrate on a gas cushion above a substrate support apparatus, wherein the substrate support apparatus is configured to support the substrate using ultrasonic levitation;
- conveying the substrate while supported on the gas cushion to a printing region of the printing system; and
- printing the substrate using a motion system configured to positioning the substrate relative to a printhead device having at least one printhead.

\* \* \* \* \*